(12) United States Patent
Yagi

(10) Patent No.: US 10,115,610 B2
(45) Date of Patent: Oct. 30, 2018

(54) SUBSTRATE PROCESSING APPARATUS

(71) Applicant: SCREEN Holdings Co., Ltd., Kyoto (JP)

(72) Inventor: Kurumi Yagi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 436 days.

(21) Appl. No.: 14/610,009

(22) Filed: Jan. 30, 2015

(65) Prior Publication Data

US 2015/0234296 A1    Aug. 20, 2015

(30) Foreign Application Priority Data

Feb. 17, 2014  (JP) ................................. 2014-027748

(51) Int. Cl.
*H01L 21/67* (2006.01)

(52) U.S. Cl.
CPC .... *H01L 21/67051* (2013.01); *H01L 21/6708* (2013.01); *H01L 21/67028* (2013.01); *H01L 21/67063* (2013.01)

(58) Field of Classification Search
CPC ......... H01L 21/67051; H01L 21/67028; H01L 21/67063; H01L 21/6708
USPC .................................................. 134/902, 200
See application file for complete search history.

(56) References Cited

U.S. PATENT DOCUMENTS

| | | | |
|---|---|---|---|
| 5,626,675 A * | 5/1997 | Sakamoto | H01L 21/6715 118/500 |
| 2005/0178321 A1* | 8/2005 | Nguyen | H01L 21/67051 118/52 |
| 2011/0240601 A1* | 10/2011 | Hashizume | H01L 21/02063 216/83 |
| 2011/0272871 A1* | 11/2011 | Park | H01L 21/6708 269/58 |
| 2012/0090647 A1 | 4/2012 | Miya et al. | 134/30 |

(Continued)

FOREIGN PATENT DOCUMENTS

| | | |
|---|---|---|
| CN | 1484279 A | 3/2004 |
| JP | 2004158482 A * | 6/2004 |
| JP | 2009283632 A * | 12/2009 |

(Continued)

OTHER PUBLICATIONS

Machine translation of JP 2013077595 A, dated Apr. 2013.*
Machine translation of JP 2004158482 A, dated Jun. 2004.*
Machine translation of JP 2009283632 A, dated Dec. 2009.*

*Primary Examiner* — Michael E Barr
*Assistant Examiner* — Kevin G Lee
(74) *Attorney, Agent, or Firm* — Ostrolenk Faber LLP

(57) ABSTRACT

A substrate processing apparatus includes a spin chuck, a shielding member disposed over the substrate, a cup surrounding a spin base, an upper gas valve that makes an inert gas be discharged from a downward discharge port of the shielding member, and an exhaust duct that discharges a gas in the cup. The shielding member includes an opposed surface disposed over the substrate and an inner peripheral surface surrounding the substrate. The lower end of the inner peripheral surface of the shielding member is disposed in the periphery of the spin base. The distance in the radial direction from the lower end of the inner peripheral surface of the shielding member to an outer peripheral surface of the spin base is not less than the distance in the vertical direction from an upper surface of the substrate to the opposed surface.

14 Claims, 7 Drawing Sheets

(56) References Cited

U.S. PATENT DOCUMENTS

| | | | |
|---|---|---|---|
| 2012/0175819 A1 | 7/2012 | Miya et al. | 264/334 |
| 2013/0171831 A1 | 7/2013 | Namba et al. | 438/748 |

FOREIGN PATENT DOCUMENTS

| | | | |
|---|---|---|---|
| JP | 2010-010433 A | | 1/2010 |
| JP | 2010-056218 | | 3/2010 |
| JP | 2013077595 A | * | 4/2013 |
| TW | 201203346 A | | 1/2012 |
| TW | 201230177 A | | 7/2012 |

\* cited by examiner

FIG. 6A SUBSTRATE CARRY-IN
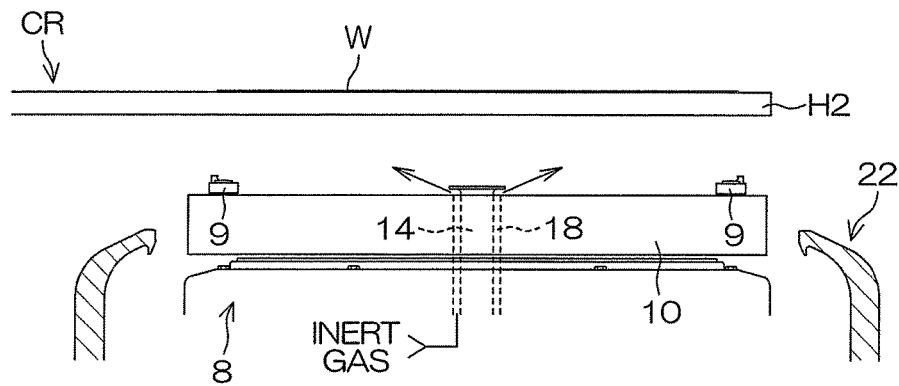
FIG. 6B LIQUID PROCESSING
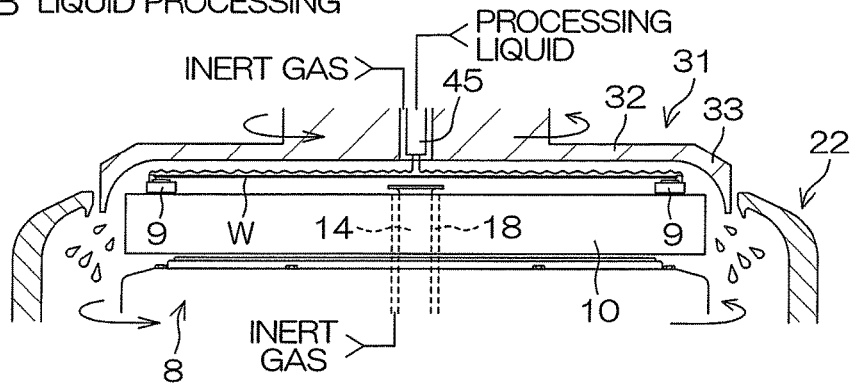
FIG. 6C DRYING
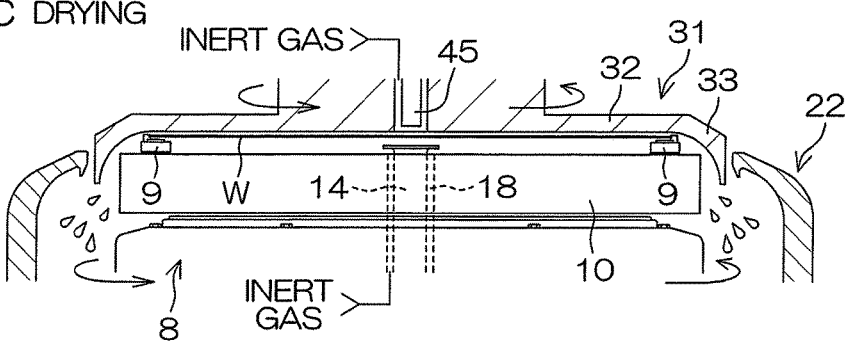

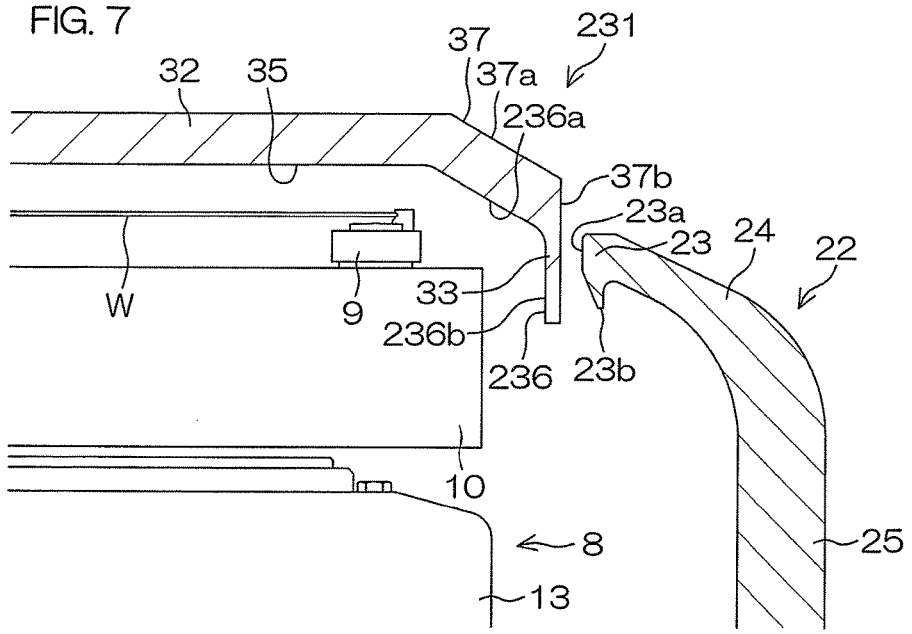
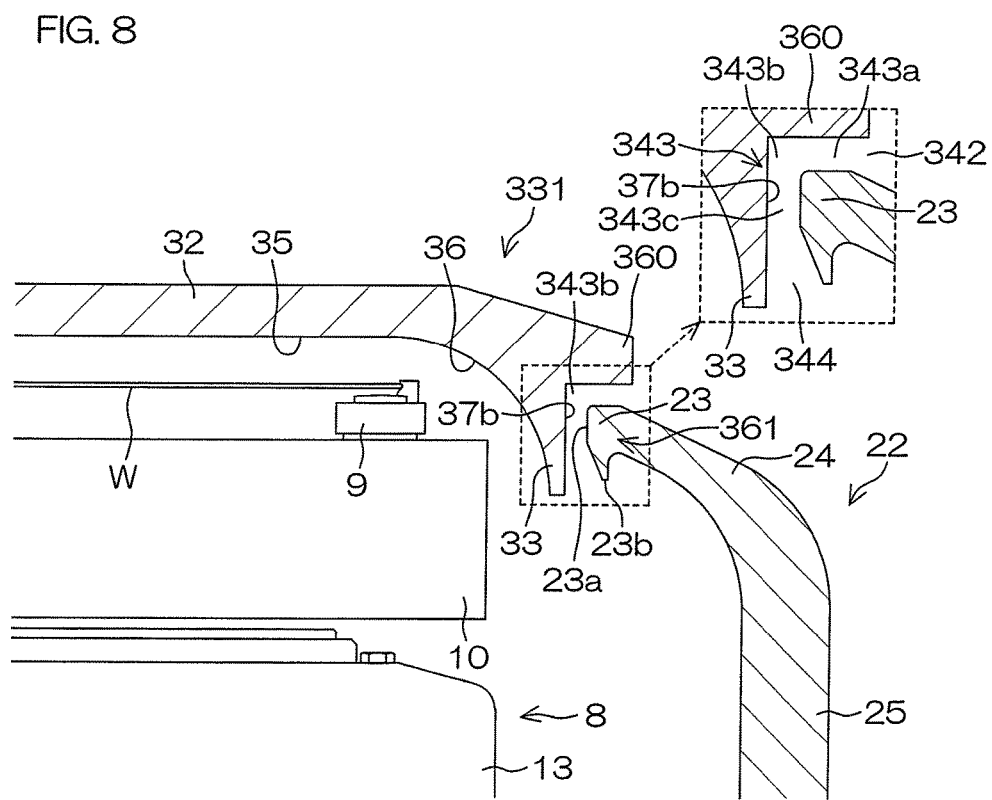

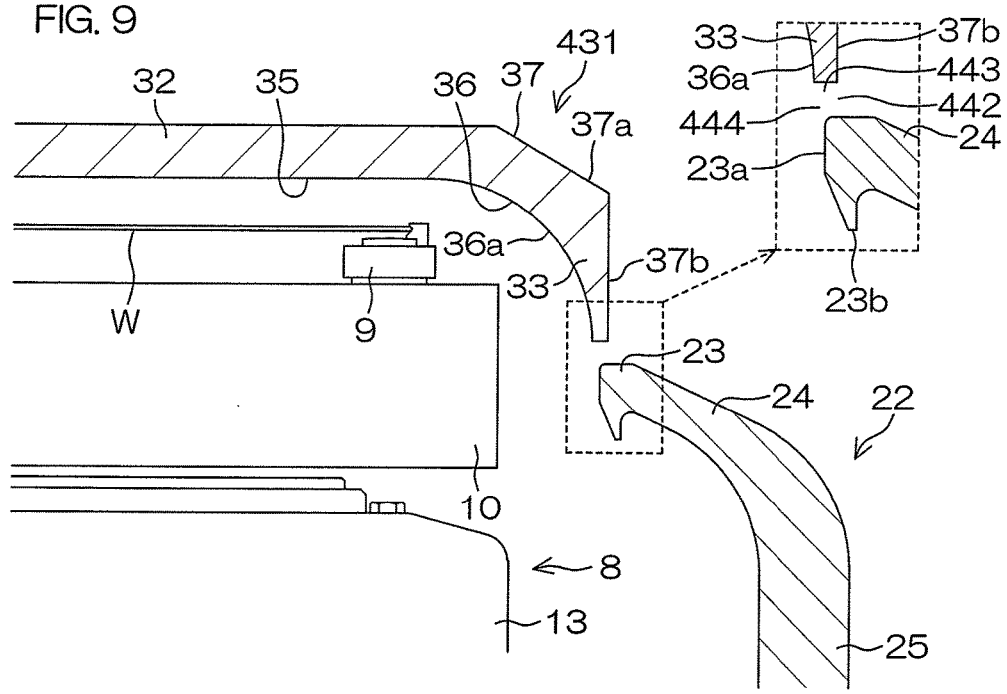
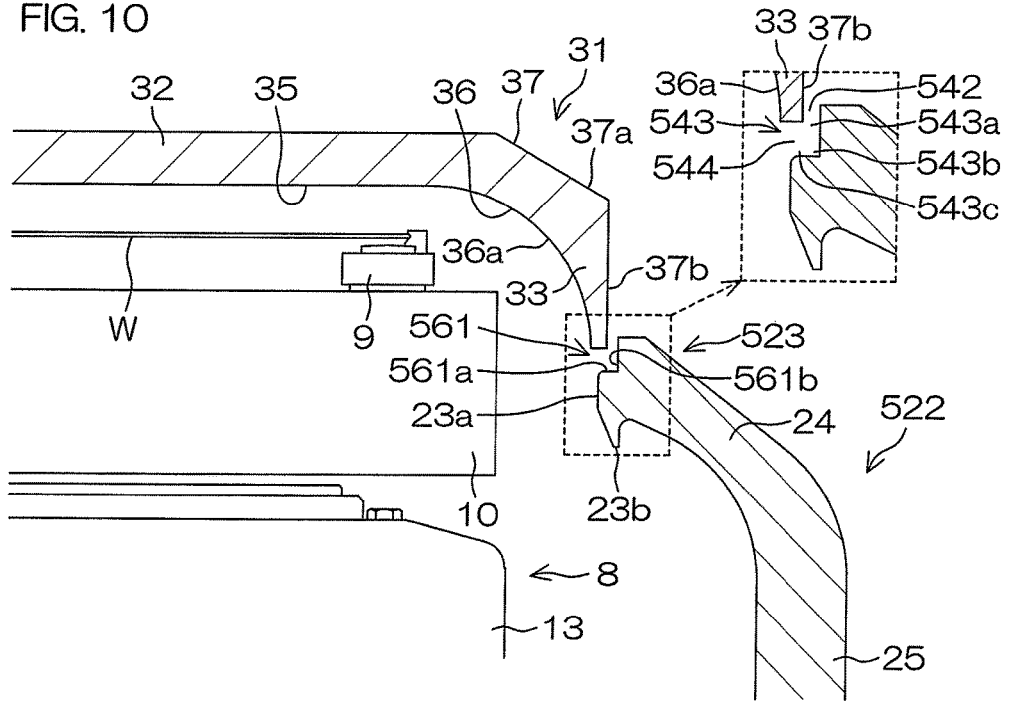

SUBSTRATE PROCESSING APPARATUS

BACKGROUND OF THE INVENTION

1. Field of the Invention

The present invention relates to a substrate processing apparatus to process a substrate. Examples of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In a manufacturing process for a semiconductor device or a liquid crystal display device, etc., a substrate processing apparatus is used to process substrates, such as semiconductor wafers, glass substrates for liquid crystal display devices, etc.

Japanese Patent Application Publication No. 2010-56218 discloses a substrate processing apparatus of a single substrate processing type to process substrates one by one. The substrate processing apparatus, in order to prevent the substrate from being oxidized by oxygen contained in a processing liquid, supplies a liquid containing inert gas dissolved water from which oxygen has been degassed and to which nitrogen gas has been added as the processing liquid to the substrate. Further, the substrate processing apparatus, in order to suppress a rise in the concentration of oxygen in an atmosphere that contacts an upper surface of the substrate, covers the substrate disposed over a spin base with a shielding member having a substrate opposing surface and a peripheral wall portion.

In a manufacturing process for a semiconductor device or a liquid crystal display device, etc., it is demanded in some cases to process a substrate in a state where the concentration of oxygen in the atmosphere is considerably low.

As described in the publication mentioned above, even when the concentration of oxygen in the processing liquid is low, because oxygen in the atmosphere dissolves in the processing liquid if the concentration of oxygen in the atmosphere is high, the processing liquid the oxygen concentration of which has been raised may be supplied to the substrate. Also, watermarks caused by oxygen in an atmosphere may occur on the substrate if the substrate is dried in a state where the concentration of oxygen in the atmosphere is high. It is therefore necessary to reduce the concentration of oxygen in an atmosphere in both of the liquid processing process and drying process.

SUMMARY OF THE INVENTION

It is an object of the present invention to reduce the concentration of oxygen in an atmosphere that contacts a substrate in order to process a substrate in an atmosphere where the concentration of oxygen is low.

A preferred embodiment of the present invention provides a substrate processing apparatus including a spin chuck including a disk-shaped spin base including a circular upper surface disposed under a substrate and an outer peripheral surface whose outer diameter is greater than that of a substrate, a plurality of chuck pins that hold a substrate horizontally such that a lower surface of the substrate and the upper surface of the spin base are opposed in an up-down direction across an interval, and a spin motor that rotates the spin base and plurality of chuck pins about a vertical rotation axis passing through a central portion of a substrate held by the plurality of chuck pins, a shielding member including an opposed surface disposed over a substrate held by the spin chuck and an inner peripheral surface surrounding the substrate held by the spin chuck about the rotation axis, in which a lower end of the inner peripheral surface is disposed in a periphery of the spin base, and a distance in a radial direction from the lower end of the inner peripheral surface to the outer peripheral surface of the spin base is not less than a distance in a vertical direction from an upper surface of a substrate held by the spin chuck to the opposed surface, an upper inert gas supply unit that causes a downward discharge port provided at the opposed surface of the shielding member to discharge downward an inert gas, a cup that is open upward, surrounding the spin base about the rotation axis, and an exhaust unit that discharges a gas in the cup to outside of the cup. When the upper surface of a substrate and the opposed surface of the shielding member are not parallel, the distance in the vertical direction from the upper surface of a substrate held by the spin chuck to the opposed surface of the shielding member means the shortest distance.

According to this arrangement, the substrate is disposed over the spin base. The opposed surface of the shielding member is disposed over the substrate. The inner peripheral surface of the shielding member is disposed around the substrate. In this state, an inert gas is discharged downward from the downward discharge port that is open in the opposed surface of the shielding member. The inert gas discharged from the downward discharge port of the shielding member spreads in a space between the upper surface of the substrate and the opposed surface of the shielding member, and is discharged from a gap between the lower end of the inner peripheral surface of the shielding member and the outer peripheral surface of the spin base. Because the space between the substrate and the shielding member is thereby filled with the inert gas, the concentration of oxygen in an atmosphere that contacts the upper surface and outer peripheral surface of the substrate is reduced.

The lower end of the inner peripheral surface of the shielding member is opposed in the radial direction to the outer peripheral surface of the spin base across an interval. The lower end of the inner peripheral surface of the shielding member and the outer peripheral surface of the spin base define an annular discharge port to discharge an atmosphere between the substrate and the shielding member. When the distance in the radial direction from the lower end of the inner peripheral surface of the shielding member and the outer peripheral surface of the spin base is small, the opening area of the discharge port is small, which thus hinders discharging the atmosphere, and the atmosphere may be retained between the substrate and the shielding member. When the retention of the atmosphere occurs, the oxygen concentration may not sufficiently decrease in a partial region between the substrate and the shielding member in some cases.

The distance in the radial direction from the lower end of the inner peripheral surface of the shielding member to the outer peripheral surface of the spin base is not less than the distance in the vertical direction from the upper surface of the substrate held by the spin chuck to the opposed surface of the shielding member. Thus, the opening area of the exhaust port can be increased as compared to when the distance in the radial direction from the lower end of the inner peripheral surface of the shielding member and the outer peripheral surface of the spin base is smaller than the distance in the vertical direction from the upper surface of the substrate supported by the spin chuck to the opposed surface of the shielding member. Because the efficiency of discharging the atmosphere is thereby enhanced, retention of the atmosphere between the substrate and the shielding member can be suppressed or prevented.

Further, the gas between the substrate and the shielding member is suctioned toward the cup. The cup surrounds the spin base. The lower end of the inner peripheral surface of the shielding member is disposed around the spin base. Thus, the lower end of the inner peripheral surface of the shielding member is disposed in the interior of the cup or in the vicinity of the opening of the cup. The lower end of the inner peripheral surface of the shielding member defines the annular exhaust port to discharge an atmosphere between the substrate and the shielding member in conjunction with the outer peripheral surface of the spin base. Thus, the exhaust port is disposed in the interior of the cup or in the vicinity of the opening of the cup. Therefore, a suction force to suck the gas into the cup is efficiently transmitted to the space between the substrate and the shielding member. Discharge of the gas from the space between the substrate and the shielding member is thereby facilitated, and the occurrence of retention is suppressed.

In the preferred embodiment, the substrate processing apparatus may further include a shielding member rotating unit that rotates the shielding member about the rotation axis in a direction the same as that of a substrate held by the spin chuck. The shielding member rotating unit may rotate the shielding member in the same direction as that of the substrate at the same speed as that of the substrate and, or may rotate the shielding member in the same direction as that of the substrate at a speed different from that of the substrate.

According to this arrangement, the shielding member rotating unit rotates the shielding member about the rotation axis in the same direction as that of the substrate. When the shielding member rotating unit rotates the shielding member, an airflow directed outward (in a direction to separate from the rotation axis) is formed between the upper surface of the substrate and the opposed surface of the shielding member. Similarly, when the spin chuck rotates the substrate, an airflow directed outward is formed between the upper surface of the substrate and the opposed surface of the shielding member. Discharge of the gas from the space between the substrate and the shielding member is facilitated by these airflows. Further, because the substrate and the shielding member are the same in rotation direction, these airflows are unlikely to cancel each other out. Thus, the gas can be efficiently discharged from the space between the substrate and the shielding member.

In the preferred embodiment, the cup may include an annular cup upper end portion that defines an annular clearance surrounding the rotation axis between the cup and the shielding member. The minimum distance between the cup upper end portion and the shielding member may be smaller than the distance in the radial direction from the lower end of the inner peripheral surface of the shielding member to the outer peripheral surface of the spin base.

According to this arrangement, an annular clearance surrounding the rotation axis is provided between the cup upper end portion and the shielding member. A gas to be suctioned into the cup flows to the interior of the cup through the annular clearance. The shortest distance between the cup upper end portion and the shielding member is smaller than the distance in the radial direction from the lower end of the inner peripheral surface of the shielding member to the outer peripheral surface of the spin base. Thus, the flow passage area of the annular clearance is small, and resistance that is applied to a gas that intends to flow in the annular clearance from over the cup is great. Therefore, the atmosphere containing oxygen is unlikely to flow into the cup.

In the preferred embodiment, the annular clearance between the cup upper end portion and the shielding member may include an annular inlet in which a gas to be suctioned into the cup flows, an annular outlet that discharges a gas having flowed in the annular inlet to an interior of the cup, and an annular flow passage extending from the annular inlet to the annular outlet.

The annular flow passage may extend upward from the annular outlet. Specifically, the annular flow passage may extend vertically upward from the annular outlet, or may extend upward from the annular outlet toward the inner side or outer side of the annular outlet. In this case, a gas that has flowed in the annular inlet is guided downward by the annular flow passage, and is discharged downward from the annular outlet. The substrate held by the spin chuck is disposed further on the inner side than the annular outlet. Thus, the atmosphere containing oxygen is less likely to approach the substrate than when the annular outlet discharges the gas inward.

The annular flow passage may include a corner portion including an L-shaped section. In this case, the annular flow passage is bent and thereby has the corner portion having the L-shaped section. Thus, resistance that is applied to a gas flowing through the annular flow passage increases as compared to when the annular flow passage is in a linear shape. Therefore, the atmosphere containing oxygen is unlikely to enter into the interior of the cup through the gap between the cup and the shielding member. Accordingly, the atmosphere containing oxygen is unlikely to approach the substrate.

In the preferred embodiment, the shielding member may include a disk portion disposed over a substrate held by the spin chuck, a cylinder portion surrounding a substrate held by the spin chuck about the rotation axis, and an annular overhanging portion disposed outward with respect to a lower end of the cylinder portion. The cup upper end portion of the cup may be disposed under the overhanging portion and surround the cylinder portion about the rotation axis across an interval in the radial direction and oppose the overhanging portion in the up-down direction across an interval.

According to this arrangement, the cup upper end portion is opposed in the up-down direction to the overhanging portion of the shielding member across an interval. Thus, the upstream portion of the annular flow passage extending in the radial direction is provided between the cup upper end portion and the overhanging portion of the shielding member. Further, the cup upper end portion is opposed in the radial direction to the cylinder portion of the shielding member across an interval. Thus, the downstream portion of the annular flow passage extending in the up-down direction is provided between the cup upper end portion and the cylinder portion of the shielding member. Therefore, the corner portion having an L-shaped section is provided between the upstream portion of the annular flow passage and the downstream portion of the annular flow passage. Resistance that is applied to a gas flowing inside the annular flow passage can thereby be increased.

In the preferred embodiment, the inner peripheral surface of the shielding member may include an annular inner inclined portion extending outward obliquely downward from the opposed surface of the shielding member. The inclination angle of the inner inclined portion with respect to the rotation axis may continuously change, or may be fixed. That is, the sectional shape of the inner inclined portion may be a curved shape, or may be a linear shape.

According to this arrangement, the annular inner inclined portion extending outward obliquely downward from the opposed surface of the shielding member is provided in the inner peripheral surface of the shielding member. The atmosphere between the substrate and the shielding member moves to the gap between the inner peripheral surface of the shielding member and the outer peripheral surface of the spin base through the space between the upper surface of the substrate and the opposed surface of the shielding member. When the inner peripheral surface of the shielding member extends vertically downward from the opposed surface of the shielding member, retention of the atmosphere is likely to occur at a coupling portion (corner portion) of the inner peripheral surface of the shielding member and the opposed surface of the shielding member. On the other hand, when the coupling portion of the inner peripheral surface of the shielding member and the opposed surface of the shielding member extends outward obliquely downward from the opposed surface, such retention is unlikely to occur. Therefore, retention of the atmosphere between the substrate and the shielding member can be suppressed or prevented.

In the preferred embodiment, the distance in the radial direction from the annular inner inclined portion of the shielding member to an outer peripheral end of the upper surface of the spin base may be not less than a distance in the vertical direction from the upper surface of a substrate held by the spin chuck to the opposed surface of the shielding member.

According to this arrangement, the inert gas discharged from the downward discharge port of the shielding member is diffused in the radial direction of the substrate in the space between the opposed surface of the shielding member and the upper surface of the substrate, and is discharged to the interior of the cup from the annular discharge port between the lower end of the inner peripheral surface of the shielding member and the outer peripheral surface of the spin base. If the height of the space where the inert gas is diffused is narrowed in the middle, the inert gas diffusion is obstructed at that narrowed part, and the inert gas may be retained. In this arrangement, because the distance in the radial direction from the annular inner inclined portion to the outer peripheral surface of the spin base is not less than the distance from the upper surface of the substrate to the opposed surface of the shielding member, the height of the diffusion space of the inert gas does not become smaller than the vertical distance of the opposed surface of the shielding member and the upper surface of the substrate. Thus, the diffusion of the inert gas is not obstructed in the course from the inert gas being discharged from the downward discharge port to the inert gas being discharged from the annular discharge port. Therefore, retention of the atmosphere between the substrate and the shielding member can be reliably suppressed or prevented.

In the preferred embodiment, the substrate processing apparatus may further include a lower inert gas supply unit that causes an upward discharge port provided at the upper surface of the spin base to discharge upward an inert gas, and a control device that controls the upper inert gas supply unit and lower inert gas supply unit such that an inert gas is discharged from the upward discharge port of the spin base in a state where an inert gas is being discharged from the downward discharge port of the shielding member.

According to this arrangement, the inert gas discharged upward from the upward discharge port of the spin base is supplied to the space between the lower surface of the substrate and the upper surface of the spin base. The concentration of oxygen in an atmosphere that contacts the lower surface of the substrate is thereby reduced.

Because the downward discharge port of the shielding member is discharging an inert gas, the atmosphere around the substrate is unlikely to enter into the space between the upper surface of the substrate and the opposed surface of the shielding member. However, it can also be considered that the atmosphere around the substrate temporarily enters into the space between the upper surface of the substrate and the opposed surface of the shielding member. For example, it can also be considered that the atmosphere between the lower surface of the substrate and the upper surface of the spin base moves to the space between the upper surface of the substrate and the opposed surface of the shielding member.

By making an inert gas be discharged from the upward discharge port of the spin base in a state where an inert gas is being discharged from the downward discharge port of the shielding member, the atmosphere containing oxygen can be suppressed or prevented from moving to the space between the upper surface of the substrate and the opposed surface of the shielding member. The concentration of oxygen in an atmosphere that contacts the substrate can thereby be reduced.

In the preferred embodiment, the substrate processing apparatus may further include a transfer robot that places a substrate on the plurality of chuck pins. The control device may control the transfer robot and lower inert gas supply unit such that a substrate is placed on the plurality of chuck pins in a state where an inert gas is being discharged from the upward discharge port of the spin base.

According to this arrangement, an inert gas is discharged from the upward discharge port of the spin base. The substrate is placed on the chuck pins by the transfer robot in this state. While the substrate is approaching the chuck pins, the inert gas discharged from the upward discharge port of the spin base spreads between the substrate and the spin base to discharge the atmosphere containing oxygen. Because not only is the interval of the substrate and the spin base narrow but the plurality of chuck pins are disposed around the space therebetween, the atmosphere between the substrate and the spin base is unlikely to be discharged. Thus, by discharging the atmosphere containing oxygen in advance, this atmosphere can be suppressed or prevented from moving from the space between the substrate and the spin base to the space between the substrate and the shielding member.

In the preferred embodiment, the cup may include an annular cup upper end portion surrounding the shielding member about the rotation axis.

According to this arrangement, the cup upper end portion is disposed around the shielding member. The cup and the shielding member define the annular outlet to discharge a gas flowed in the gap between the cup and the shielding member from the gap therebetween. Because the cup upper end portion is disposed in the periphery of the shielding member, the annular outlet is further away outward from the substrate than when the cup upper end portion is disposed under the shielding member. Thus, a gas suctioned into the cup is unlikely to enter into the space between the substrate and the shielding member. Further, because the cup upper end portion is not overlapped with the shielding member in a plan view, the cup upper end portion does not contact the shielding member even if one or both of the cup and the shielding member are raised or lowered.

In the preferred embodiment, the cup may include an annular cup upper end portion disposed under the shielding member.

According to this arrangement, the cup upper end portion is disposed under the shielding member. The cup and the shielding member define the annular outlet to discharge a gas flowed in the gap between the cup and the shielding member from the gap therebetween. Because the cup upper end portion is disposed under the shielding member, the annular outlet is further away downward from the substrate than when the cup upper end portion is disposed around the shielding member. Thus, a gas suctioned into the cup is unlikely to enter into the space between the substrate and the shielding member.

In the preferred embodiment, the substrate processing apparatus may further include a transfer robot including a hand that is movable to over the spin base, and performing a carry-in operation to place a substrate on the plurality of chuck pins and a carry-out operation to take a substrate on the plurality of chuck pins by use of the hand, and a processing liquid supply unit that causes the downward discharge port provided at the opposed surface of the shielding member to discharge downward a processing liquid in a state where the cup is located lower than the upper surface of the spin base.

In the conventional substrate processing apparatus, the cup upper end portion is disposed higher than the substrate held by the spin chuck in order to receive a processing liquid having scattered from the substrate to its periphery by an inner surface of the cup. On the other hand, because the hand of the transfer robot is disposed over the spin base when the substrate is carried in and carried out, the cup upper end portion is disposed lower than the upper surface of the spin base in order to avoid a collision of the hand with the cup when the substrate is carried in and carried out. It is thus necessary to raise and lower the cup such that the cup upper end portion moves at a position higher than the upper surface of the spin base and a position lower than the upper surface of the spin base.

In contrast thereto, in the substrate processing apparatus according to a preferred embodiment of the present invention, the inner peripheral surface of the shielding member is disposed around the substrate held by the spin chuck. A processing liquid discharged from the substrate to the periphery is received by the inner peripheral surface of the shielding member to be guided downward. Thereafter, the processing liquid flows down into the cup that is open upward. Thus, the cup upper end portion does not need to be disposed higher than the substrate when the processing liquid is being discharged from the downward discharge port of the shielding member. Therefore, the cup does not need to be raised or lowered before or after the substrate is carried in and carried out. The time required for carrying in and carrying out the substrate can be reduced.

In the preferred embodiment, the substrate processing apparatus may further include a processing liquid supply unit that causes the downward discharge port provided at the opposed surface of the shielding member to discharge downward a processing liquid containing inert gas dissolved water from which oxygen has been degassed and to which an inert gas has been added.

According to this arrangement, because the amount of oxygen contained in the processing liquid to be supplied to the substrate is reduced, the processing quality of the substrate can be enhanced.

In the preferred embodiment, the substrate processing apparatus may be an apparatus to process a substrate with a metal pattern exposed at a front surface (device forming surface) of the substrate.

According to this arrangement, because substrate processing is performed in a state where the concentration of oxygen in an atmosphere that contacts the substrate has been reduced, oxidation of the metal pattern caused by contact with oxide in a processing liquid or in an atmosphere can be suppressed or prevented. The processing quality of the substrate can thereby be enhanced.

The above and other elements, features, steps, characteristics, and advantages of the present invention will become more apparent from the following detailed description of the preferred embodiments with reference to the attached drawings.

BRIEF DESCRIPTION OF THE DRAWINGS

FIG. 2 shows a state in which a shielding member is disposed at an up-position, and a cup is disposed at a down-position.

FIG. 3 shows a state in which the shielding member is disposed at a down-position, and the cup is disposed at an up-position.

FIG. 6A is a view showing a state before a center robot places a substrate on a spin chuck.

FIG. 6B is a view showing a state in which a liquid processing process is being performed.

FIG. 6C is a view showing a state in which a drying process is being performed.

FIG. 7 is an enlarged view showing a portion of the cup and shielding member according to a second preferred embodiment of the present invention. FIG. 7 shows a state in which the shielding member is disposed at a down-position, and the cup is disposed at an up-position.

FIG. 8 is an enlarged view showing a portion of the cup and shielding member according to a third preferred embodiment of the present invention. FIG. 8 shows a state in which the shielding member is disposed at a down-position, and the cup is disposed at an up-position. In FIG. 8, a portion of the cup and shielding member is shown in a further enlarged manner.

FIG. 9 is an enlarged view showing a portion of the cup and shielding member according to a fourth preferred embodiment of the present invention. FIG. 9 shows a state in which the shielding member is disposed at a down-position, and the cup is disposed at an up-position. In FIG. 9, a portion of the cup and shielding member is shown in a further enlarged manner.

FIG. 10 is an enlarged view showing a portion of the cup and shielding member according to a fifth preferred embodiment of the present invention. FIG. 10 shows a state in which the shielding member is disposed at a down-position, and the cup is disposed at an up-position. In FIG. 10, a portion of the cup and shielding member is shown in a further enlarged manner.

DETAILED DESCRIPTION OF THE PREFERRED EMBODIMENTS

Figure 1:
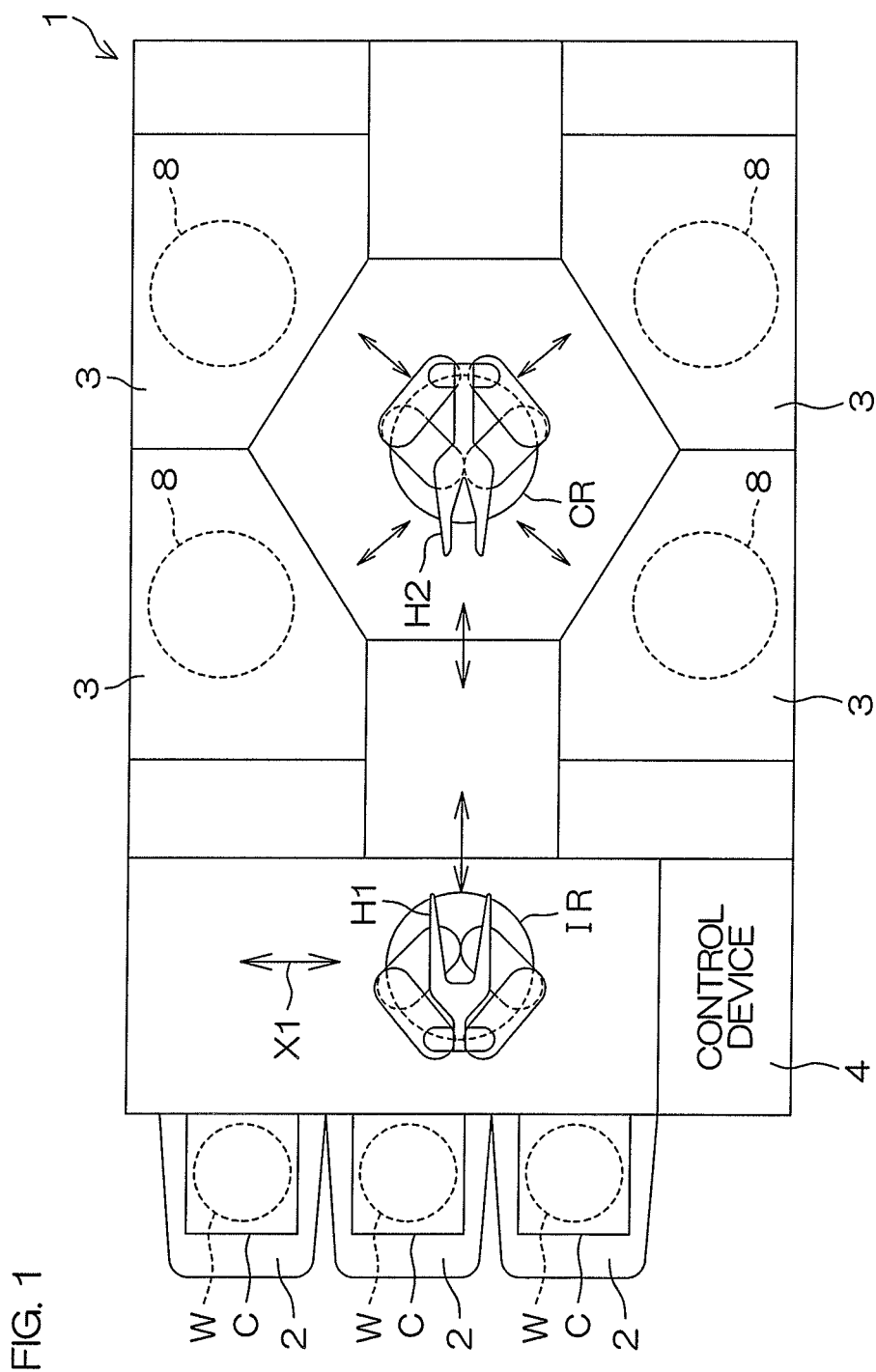
FIG. 1 is a schematic plan view of a substrate processing apparatus according to a first preferred embodiment of the present invention.

FIG. 1 is a schematic plan view of a substrate processing apparatus 1 according to a first preferred embodiment of the present invention. The substrate processing apparatus 1 is a single substrate processing type apparatus that processes disk-shaped substrates W such as semiconductor wafers one by one.

As shown in FIG. 1, the substrate processing apparatus 1 includes a plurality of load ports 2 that hold a plurality of carriers C, and a plurality of (e.g., 12) processing units 3 that process the substrates W. The substrate processing apparatus 1 further includes an indexer robot IR that transfers the substrate W on a path between the load port 2 and the processing unit 3, a center robot CR that transfers the substrate W on a path between the indexer robot IR and the processing unit 3, and a control device 4 that controls the substrate processing apparatus 1.

As shown in FIG. 1, the load port 2 serving as a container holding unit is disposed at a position separate in the horizontal direction from the processing unit 3. The plurality of load ports 2 hold the plurality of carriers C such that the plurality of carriers C are arrayed in a horizontal array direction X1. The carrier C is a container capable of housing a plurality of substrates W such that the plurality of substrates W are arranged and spaced apart in the vertical direction in a horizontal posture.

As shown in FIG. 1, the indexer robot IR includes a plurality of (e.g., two) hands H1 showing U-shapes in a plan view. The two hands H1 are disposed at different heights. Each hand H1 supports the substrate W in a horizontal posture. The indexer robot IR moves the hand H1 in at least one of the horizontal direction and vertical direction. Further, the indexer robot IR turns the hand H1 around by rotating (spinning) about its vertical axis. The indexer robot IR moves in the array direction X1 along a path passing a transfer position (the position shown in FIG. 1). The transfer position is a position where the indexer robot IR and the center robot CR are opposed in a direction perpendicular to the array direction X1 in a plan view.

The indexer robot IR, by moving the hand H1 in at least one of the horizontal direction and vertical direction, makes the hand H1 opposed to the center robot CR or an arbitrary carrier C. The indexer robot IR performs a carry-in operation to carry the substrate W into the carrier C and a carry-out operation to carry the substrate W out of the carrier C. Also, the indexer robot IR, in cooperation with the center robot CR, performs at the transfer position a transfer operation to move the substrate W from one to the other of the indexer robot IR and the center robot CR.

As shown in FIG. 1, the center robot CR includes a plurality of (e.g., two) hands H2 showing U-shapes in a plan view. The two hands H2 are disposed at different heights. Each hand H2 supports the substrate W in a horizontal posture. The center robot CR moves the hand H2 in at least one of the horizontal direction and vertical direction. Further, the center robot CR turns the hand H2 around by rotating (spinning) about its vertical axis. The plurality of processing units 3 form four towers disposed so as to surround the center robot CR in a plan view. Each tower is composed of three processing units 3 stacked one on top of the other.

The center robot CR, by moving the hand H2 in at least one of the horizontal direction and vertical direction, makes the hand H2 opposed to the indexer robot IR or an arbitrary processing unit 3. Then, the center robot CR performs a carry-in operation to carry the substrate W into the processing unit 3 and a carry-out operation to carry the substrate W out of the processing unit 3. Also, the center robot CR, in cooperation with the indexer robot IR, performs a transfer operation to move the substrate W from one to the other of the indexer robot IR and the center robot CR.

Figure 2:
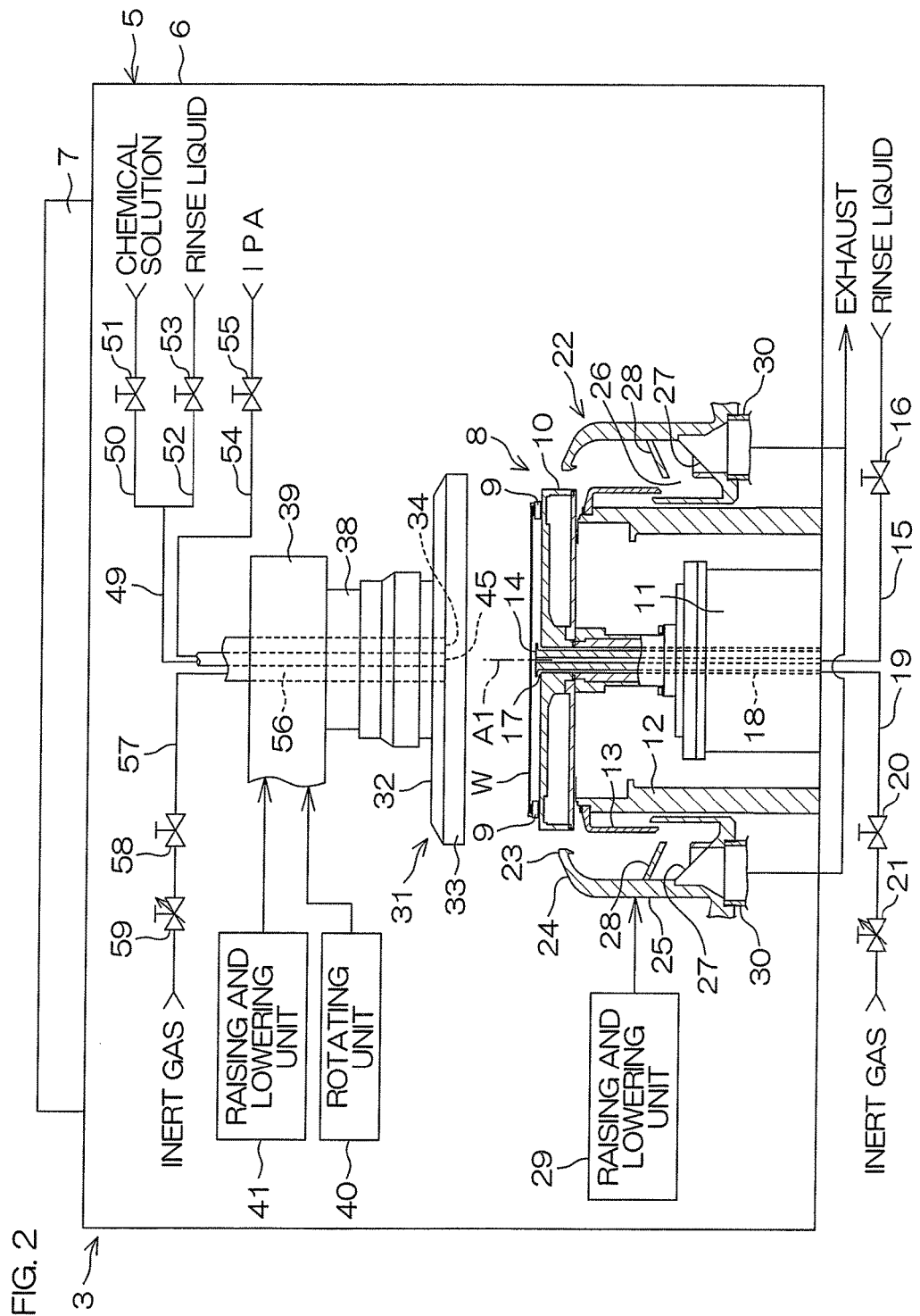
FIG. 2 is a schematic view of the interior of a chamber included in the substrate processing apparatus when viewed horizontally.

As shown in FIG. 2, each processing unit 2 is a single substrate processing type unit that processes a plurality of substrates W one by one using a processing liquid. Each processing unit 3 includes a box-shaped chamber 5 having an internal space, and a spin chuck 8 that holds a single substrate W in a horizontal posture inside the chamber 5 while rotating the substrate W about a vertical rotation axis A1 passing a central portion of the substrate W. Each processing unit 3 further includes a cup 22 surrounding the spin chuck 8 about the rotation axis A1, and a disk-shaped shielding member 31 disposed over the spin chuck 8 in a horizontal posture.

As shown in FIG. 2, the chamber 5 includes a box-shaped partition wall 6 that houses the spin chuck 8 and the like, and a FFU 7 (fan filter unit 7) serving as a blower unit that feeds clean air (air filtered by a filter) into the partition wall 6 from an upper portion of the partition wall 6. The FFU 7 is disposed over the partition wall 6. The FFU 10 feeds the clean air downward from a ceiling of the partition wall 6 into the chamber 5. Thereby, a downflow flowing downward in the chamber 5 is formed by the FFU 7. The substrate W is processed in a state where the downflow is being formed inside the chamber 5.

As shown in FIG. 2, the spin chuck 8 includes a plurality of chuck pins 9 that are pressed against an outer peripheral portion of the substrate W, and a disk-shaped spin base 10 that is rotatable about the rotation axis A1 together with the plurality of chuck pins 9. The spin chuck 8 further includes a spin motor 11 that rotates the spin base 10 and the chuck pins 9 about the rotation axis A1, a tubular housing 12 surrounding the spin motor 11, and a tubular cover 13 surrounding the housing 12. Although not illustrated, the spin chuck 8 further includes a chuck opening/closing mechanism that opens and closes the plurality of chuck pins 9.

As shown in FIG. 2, the chuck pins 9 project upward from an upper surface outer peripheral portion of the spin base 10. The chuck pins 9 are held by the spin base 10. The plurality of chuck pins 9 are disposed at intervals in a circumferential direction (direction about the rotation axis A1). The spin base 10 includes a circular upper surface parallel to a lower surface of the substrate W, and a cylindrical outer peripheral surface disposed lower than the upper surface. The outer diameter of the upper surface and outer peripheral surface of the spin base 10 is greater than the outer diameter of the substrate W. A center line of the upper surface and outer peripheral surface of the spin base 10 is disposed on the rotation axis A1. The housing 12 and the spin motor 11 are disposed under the spin base 10. The outer diameter of the housing 12 is smaller than the outer diameter of the spin base 10.

Figure 3:
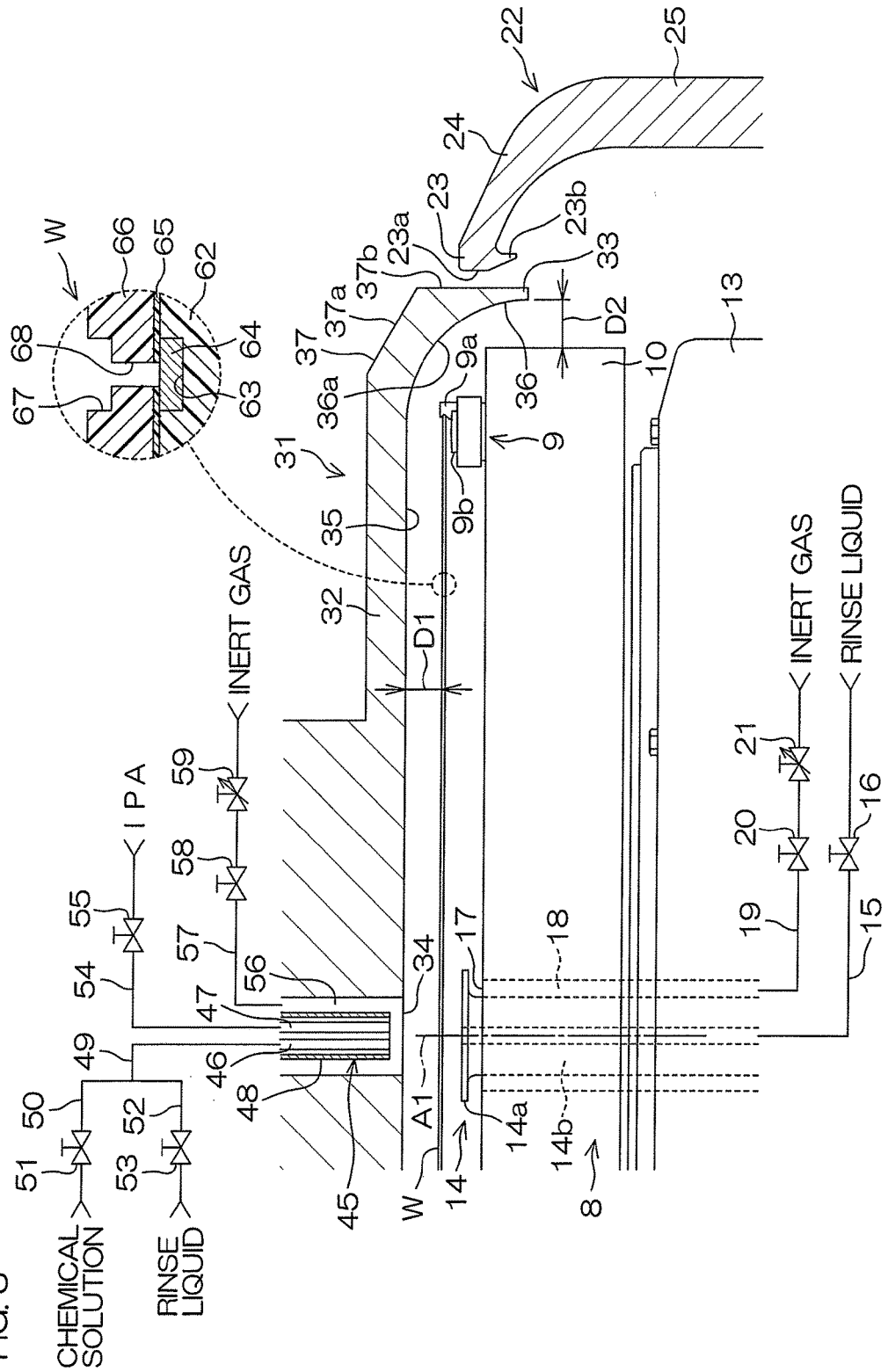
FIG. 3 is an enlarged view showing a portion of the cup and shielding member disposed in the chamber.

As shown in FIG. 3, the chuck pin 9 includes a grip portion 9a that is pressed against an outer peripheral portion of the substrate W, and a support portion 9b that supports a lower surface outer peripheral portion of the substrate W. The chuck pin 9 is pivotable with respect to the spin base 10 about a vertical pin pivot axis between a close position (the position shown in FIG. 3) where the grip portion 9a is pressed against the outer peripheral portion of the substrate W and an open position where the grip portion 9a separates from the outer peripheral portion of the substrate W. The plurality of grip portions 9a, by contact of the outer peripheral portion of the substrate W and each grip portion 9a, support the substrate W horizontally at a position (the position shown in FIG. 3) higher than the upper surface of the spin base 10. The plurality of support portions 9b, by contact of the lower surface outer peripheral portion of the substrate W and each support portion 9b, support the substrate W horizontally at a position higher than the upper surface of the spin base 10.

When the substrate W is carried into the chamber 5, the center robot CR places the substrate W on the plurality of support portions 9b in a state where the chuck pins 9 are located at the open position. Also, when the substrate W is carried out of the chamber 5, the center robot CR takes the substrate W on the plurality of support portions 9b in a state where the chuck pins 9 are located at the open position. When the chuck pin 9 has moved from the open position to the close position in a state where the substrate W is supported by the plurality of support portions 9b, each grip portion 9a is pressed against the outer peripheral portion of the substrate W. The substrate W is thereby held by the plurality of grip portions 9a. When the spin motor 11 rotates in this state, the substrate W rotates about the rotation axis A1 together with the spin base 10 and the chuck pins 9.

As shown in FIG. 3, the processing unit 3 includes a lower surface nozzle 14 that discharges a processing liquid toward a lower surface central portion of the substrate W, a lower rinse liquid piping 15 that leads a rinse liquid to the lower surface nozzle 14, and a lower rinse liquid valve 16 interposed in the lower rinse liquid piping 15.

As shown in FIG. 3, the lower surface nozzle 14 includes a nozzle disk portion 14a disposed in a horizontal posture at a height between an upper surface central portion of the spin base 10 and the lower surface central portion of the substrate W, and a nozzle tubular portion 14b extending downward from the nozzle disk portion 14a. The lower surface nozzle 14 has a discharge port opened in an upper surface central portion of the nozzle disk portion 14a. In a state where the substrate W is held by the spin chuck 8, the discharge port of the lower surface nozzle 14 is opposed in the up-down direction to the lower surface central portion of the substrate W. When the lower rinse liquid valve 16 is opened in this state, the rinse liquid discharged upward from the lower surface nozzle 14 is supplied to the lower surface central portion of the substrate W.

The rinse liquid to be supplied to the lower surface nozzle 14 is pure water (deionized water) from which oxygen has been degassed and to which nitrogen gas has been added. That is, the rinse liquid is inert gas dissolved water from which oxygen has been degassed and to which an inert gas has been added. The concentration of oxygen in the pure water is, for example, 20 ppb or less, and the concentration of nitrogen in the pure water is, for example, 7 ppm to 24 ppm. The rinse liquid to be supplied to the lower surface nozzle 14 may be pure water for which no degassing of oxygen or addition of nitrogen gas has been performed. Also, the rinse liquid to be supplied to the lower surface nozzle 14 is not limited to pure water, but may be any one of the IPA (isopropyl alcohol), carbonated water, electrolyzed ion water, hydrogen water, ozone water, and aqueous hydrochloric acid of a dilute concentration (e.g., about 1 to 100 ppm).

As shown in FIG. 3, the processing unit 3 includes a tubular lower gas flow passage 18 that is defined by an outer peripheral surface of the lower surface nozzle 14 and an inner peripheral surface of the spin base 10, a lower gas piping 19 that leads an inert gas from an inert gas supply source to the lower gas flow passage 18, a lower gas valve 20 interposed in the lower gas piping 19, and a lower gas flow control valve 21 that increases and decreases the flow rate of the inert gas to be supplied from the lower gas piping 19 to the lower gas flow passage 18.

As shown in FIG. 3, the lower gas flow passage 18 includes an annular upward discharge port 17 that is opened at the upper surface central portion of the spin base 10. The upward discharge port 17 is disposed under the nozzle disk portion 14a of the lower surface nozzle 14. When the lower gas valve 20 is opened, the inert gas from the inert gas supply source is discharged upward from the upward discharge port 17 at a flow rate corresponding to the opening degree of the lower gas flow control valve 21. Thereafter, the inert gas discharged from the upward discharge port 17 spreads radially between the lower surface of the substrate W and the upper surface of the spin base 10. Thereby, the space between the lower surface of the substrate W and the upper surface of the spin base 10 is filled with the inert gas. The inert gas to be discharged from the upward discharge port 17 is nitrogen gas. The inert gas is not limited to nitrogen gas, and may be another inert gas such as helium gas or argon gas.

As shown in FIG. 3, the cup 22 includes an annular cup upper end portion 23 having an inner diameter greater than the outer diameter of the spin base 10, an annular cup inclined portion 24 extending outward obliquely downward from the cup upper end portion 23, and a cup tubular portion 25 extending downward from an outer peripheral portion of the cup inclined portion 24. The cup upper end portion 23 includes an annular cup inner peripheral end 23a that defines a circular opening having a diameter greater than the outer diameter of the spin base 10, and a cup lower end 23b extending downward from the inner end of the cup inclined portion 24. The cup inner peripheral end 23a is a portion that is positioned most inward in the cup upper end portion 23.

As shown in FIG. 2, the cup 22 includes an annular receiving groove 26 into which a liquid having passed through a gap between the cup 22 and the spin chuck 8 gathers, an exhaust port 27 that is opened in an inner surface of the receiving groove 26, and a cover 28 disposed over the exhaust port 27. Although not illustrated, the cup 22 further includes a drain port that is opened in the inner surface of the receiving groove 26. The inner surface of the receiving groove 26 includes an annular bottom surface surrounding the spin chuck 8, an inner peripheral surface extending upward from the inner peripheral end of the bottom surface, and an outer peripheral surface extending upward from the outer peripheral end of the bottom surface. The exhaust port 27 and the drain port are opened in the bottom surface of the receiving groove 26. The exhaust port 27 and the drain port are arrayed in the circumferential direction at a distance. The cup upper end portion 23 is disposed over the receiving groove 26.

As shown in FIG. 2, the processing unit 3 includes a cup raising/lowering unit 29 that raises and lowers the cup between an up-position and a down-position. The down-position (position shown in FIG. 2) is a retraction position where the cup upper end portion 23 is located lower than the upper surface of the spin base 10. The up-position (position shown in FIG. 3) is a processing position higher than the down-position. The cup raising/lowering unit 29 can locate the cup 22 at an arbitrary position (height) from the up-position to the down-position.

As shown in FIG. 2, the processing unit 3 includes an exhaust duct 30 that leads exhaust to be discharged outside of the processing unit 3 from the exhaust port 27 of the cup 22. Although not illustrated, the processing unit 3 further includes a damper that adjusts the flow rate of the exhaust to be discharged from the exhaust port 27 to the exhaust duct 30. The exhaust pressure (negative pressure) in the exhaust duct 30 is adjusted by the damper. The exhaust duct 30 is connected to exhaust treatment equipment that suctions gas. A gas in the processing unit 3 is discharged to the exhaust treatment equipment at all times. The exhaust treatment equipment is installed in a plant where the substrate processing apparatus 1 is installed. Thus, the gas in the processing unit 3 is discharged out of the processing unit 3 through the exhaust port 27 of the cup 22.

As shown in FIG. 3, the shielding member 31 is in a disk shape greater than the outer diameter of the substrate W. The shielding member 31 includes a disk portion 32 held in a horizontal posture, and a cylinder portion 33 extending downward from an outer peripheral portion of the disk portion 32. The shielding member 31 includes a cup-shaped inner surface that is recessed upward. The inner surface of the shielding member 31 includes an opposed surface 35 and an inner peripheral surface 36. As shown in FIG. 2, the shielding member 31 is supported in a horizontal posture by a support shaft 38 extending in the up-down direction along the rotation axis A1. The shielding member 31 is disposed under the support shaft 38. A center line (center line of the disk portion 32 to be described later) of the shielding member 31 is disposed on the rotation axis A1. The support shaft 38 is supported over the shielding member 31 by a horizontally extending support arm 39.

As shown in FIG. 3, the disk portion 32 of the shielding member 31 is coaxial with the cylinder portion 33. The disk portion 32 is disposed higher than the lower end of the cylinder portion 33. A lower surface of the disk portion 32 is disposed over the substrate W. The lower surface of the disk portion 32 corresponds to the opposed surface 35 that is opposed to an upper surface of the substrate W. The opposed surface 35 of the disk portion 32 is parallel to the upper surface of the substrate W. The opposed surface 35 of the disk portion 32 is opposed in the up-down direction to the upper surface of the substrate W at an interval. The disk portion 32 includes a downward discharge port 34 that is opened at a central portion of the opposed surface 35. The downward discharge port 34 is disposed on the rotation axis A1.

As shown in FIG. 3, the cylinder portion 33 of the shielding member 31 includes an outer peripheral surface 37 extending downward from an upper surface of the disk portion 32. The outer peripheral surface 37 includes an annular outer inclined portion 37a extending outward obliquely downward from the upper surface of the disk portion 32, and an annular outer vertical portion 37b extending vertically downward from the lower end (outer end) of the outer inclined portion 37a. The outer inclined portion 37a has a linear section that is obliquely inclined at a fixed inclination angle with respect to the rotation axis A1. The outer diameter of the outer inclined portion 37a increases as it gets closer to the lower end of the outer inclined portion 37a. The lower end of the outer inclined portion 37a has an outer diameter equal to the outer diameter of the outer vertical portion 37b. The outer diameter of the outer vertical portion 37b is greater than the outer diameter of the spin base 10.

As shown in FIG. 3, the cylinder portion 33 of the shielding member 31 includes an inner peripheral surface 36 extending downward from the opposed surface 35 of the disk portion 32. The inner peripheral surface 36 includes an annular inner inclined portion 36a extending outward obliquely downward from the opposed surface 35 of the disk portion 32. The inner inclined portion 36a has an arc-shaped section the inclination angle of which with respect to the rotation axis A1 continuously changes. The section of the inner inclined portion 36a is open downward. The inner diameter of the inner peripheral surface 36 increases as it gets closer to the lower end of the inner peripheral surface 36. The lower end of the inner peripheral surface 36 has an inner diameter greater than the outer diameter of the spin base 10. The lower end of the inner peripheral surface 36 is disposed at a height equal to the lower end of the outer peripheral surface 37 of the cylinder portion 33.

As shown in FIG. 2, the processing unit 3 includes a shielding member rotating unit 40 that rotates the shielding member 31 about the center line (rotation axis A1) of the shielding member 31. Although not illustrated, the shielding member rotating unit 40 includes a motor and a transmitting mechanism that transmits a rotation of the motor to the shielding member 31. The shielding member rotating unit 40 rotates the shielding member 31 and the support shaft 38 about the center line of the shielding member 31 with respect to the support arm 39. The shielding member 31 is rotatable in the same direction as a rotation direction by the spin chuck 8 (rotation direction of the substrate W). The rotating speed of the shielding member 31 is controlled by the control device 4.

As shown in FIG. 2, the processing unit 3 includes a shielding member raising/lowering unit 41 that raises and lowers the shielding member 31 and the support shaft 38 by raising and lowering the support arm 39 in the vertical direction. The shielding member raising/lowering unit 41 raises and lowers the shielding member 31 in the vertical direction between an up-position and a down-position. The up-position (the position shown in FIG. 2) is a retraction position where the distance in the vertical direction from the upper surface of the substrate W to the opposed surface 35 of the shielding member 31 is greater than the thickness of the spin base 10 (length in the vertical direction of the outer peripheral surface of the spin base 10). The down-position (the position shown in FIG. 3) is a proximity position where the distance in the vertical direction from the upper surface of the substrate W to the opposed surface 35 of the shielding member 31 is smaller than the thickness of the spin base 10. The shielding member raising/lowering unit 41 can locate the shielding member 31 at an arbitrary position (height) from the up-position to the down-position.

The down-position of the shielding member 31 includes a liquid processing position (the position shown in FIG. 6B) to supply the processing liquid to the upper surface of the substrate W, and a drying position (the position shown in FIG. 6C) to dry the substrate W. The liquid processing position and the drying position are both positions where the distance in the vertical direction from the upper surface of the substrate W to the opposed surface 35 of the shielding member 31 is smaller than the thickness of the spin base 10. The liquid processing position is a position where the opposed surface 35 of the shielding member 31 is opposed to a liquid on the substrate W at an interval. The liquid processing position and the drying position may be positions equal to each other, and may be positions different from each other. Also, the liquid processing position may include a chemical solution supply position to supply a chemical solution to the upper surface of the substrate W, a rinse liquid supply position to supply a rinse liquid to the upper surface of the substrate W, and a solvent supply position to supply a solvent to the upper surface of the substrate W. In this case, two or more of the chemical solution supply position, rinse liquid supply position, and solvent supply position may be the same position (height).

As shown in FIG. 3, when the shielding member 31 is disposed at the down-position (liquid processing position or drying position), the lower end of the inner peripheral surface 36 of the shielding member 31 is disposed lower than the upper surface of the spin base 10, and is located at a height equal to a portion of the outer peripheral surface of the spin base 10. The up-position of the cup 22 is a position where the cup inner peripheral end 23a is located higher than the lower end of the cylinder portion 33 of the shielding member 31. When the shielding member 31 is disposed at the down-position and the cup 22 is disposed at the up-position, the cup inner peripheral end 23a is disposed higher than the lower end of the inner peripheral surface 36 of the shielding member 31, and is located at a height equal to a portion of the cylinder portion 33. At this time, a gas over the cup 22 flows into the cup 22 through a gap between the cup 22 and the shielding member 31, and is discharged to the exhaust duct 30.

Figure 4:
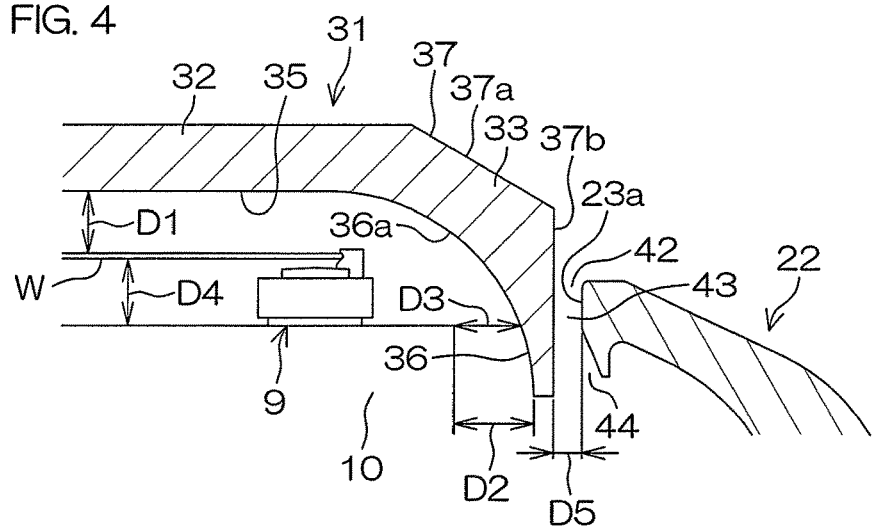
FIG. 4 is a partially enlarged view of FIG. 3.

As shown in FIG. 4, when the shielding member 31 is disposed at the down-position and the cup 22 is disposed at the up-position, the cup upper end portion 23 is away from the shielding member 31 across the entire circumference of the cup 22. At this time, the cup 22 and the shielding member 31 define, between the cup 22 and the shielding member 31, an annular inlet 42 in which a gas to be suctioned into the cup 22 flows, an annular outlet 44 that discharges a gas having flowed in the annular inlet 42 to the interior of the cup 22, and an annular flow passage 43 extending from the annular inlet 42 to the annular outlet 44. The annular inlet 42 is disposed over the annular outlet 44. The annular flow passage 43 extends upward from the annular outlet 44. Thus, the gas flowed into the annular inlet 42 is guided downward by the annular flow passage 43, and is discharged downward from the annular outlet 44.

As shown in FIG. 3, the processing unit 3 includes a center nozzle 45 that discharges a processing liquid downward via the downward discharge port 34 of the shielding member 31. The center nozzle 45 extends in the up-down direction along the center line (rotation axis A1) of the shielding member 31. A lower end portion of the center nozzle 45 is disposed higher than the opposed surface 35 of the shielding member 31. The center nozzle 45 rises and falls together with the shielding member 31. On the other hand, even if the shielding member 31 rotates about the rotation axis A1, the center nozzle 45 does not rotate.

As shown in FIG. 3, the center nozzle 45 includes a plurality of inner tubes (a first tube 46 and a second tube 47) extending in the up-down direction along the rotation axis A1, and a tubular casing 48 surrounding the plurality of inner tubes. The plurality of inner tubes include a first tube 46 that discharges a chemical solution or rinse liquid toward an upper surface central portion of the substrate W, and a second tube 47 that discharges a solvent toward an upper surface central portion of the substrate W. The casing 48 extends in the up-down direction along the rotation axis A1. An inner peripheral surface of the shielding member 31 surrounds an outer peripheral surface of the casing 48 at an interval in the radial direction.

As shown in FIG. 3, the processing unit 3 includes an upper processing liquid piping 49 that leads a processing liquid to the first tube 46, an upper chemical solution piping 50 that leads a chemical solution to the upper processing liquid piping 49, an upper chemical solution valve 51 interposed in the upper chemical solution piping 50, and an upper rinse liquid piping 52 that leads a rinse liquid to the upper processing liquid piping 49, and an upper rinse liquid valve 53 interposed in the upper rinse liquid piping 52. The processing unit 3 includes an upper solvent piping 54 that leads a solvent to the second tube 47, and an upper solvent valve 55 interposed in the upper solvent piping 54.

When the upper chemical solution valve 51 is opened, the chemical solution in the upper chemical solution piping 50 is supplied to the first tube 46 via the upper processing liquid piping 49. Similarly, when the upper rinse liquid valve 53 is opened, the rinse liquid in the upper rinse liquid piping 52 is supplied to the first tube 46 via the upper processing liquid piping 49. The chemical solution or rinse liquid is thereby discharged downward from a lower end portion of the first tube 46. In addition, when the upper solvent valve 55 is opened, the solvent in the upper solvent piping 54 is supplied to the second tube 47. The solvent is thereby discharged downward from a lower end portion of the second tube 47.

The solvent (liquid) to be supplied to the center nozzle 45 is IPA. IPA is an example of a volatile solvent that is higher in volatility than water and is lower in surface tension than water. The solvent to be supplied to the center nozzle 45 is not limited to IPA, and may be HFE (hydrofluoroether) or another solvent such as a mixture of IPA and HFE.

The rinse liquid to be supplied to the center nozzle 45 is pure water from which oxygen has been degassed and to which nitrogen gas has been added. That is, the rinse liquid is inert gas dissolved water in which nitrogen gas being an example of the inert gas is dissolved. The concentrations of oxygen and nitrogen in the pure water are the same as the concentrations described above. The rinse liquid to be supplied to the center nozzle 45 may be pure water for which no degassing of oxygen or addition of nitrogen gas has been performed. Also, the rinse liquid to be supplied to the center nozzle 45 is not limited to pure water, but may be any one of the carbonated water, electrolyzed ion water, hydrogen water, ozone water, and aqueous hydrochloric acid of a dilute concentration (e.g., about 10 to 100 ppm).

The chemical solution to be supplied to the center nozzle 45 is, for example, a solution containing at least one of the sulfuric acid, acetic acid, nitric acid, hydrochloric acid, hydrofluoric acid, aqueous ammonia, hydrogen peroxide solution, organic acid (e.g., citric acid or oxalic acid), organic alkali (e.g., TMAH: tetramethylammonium hydroxide), surfactant, and corrosion inhibitor. In the first preferred embodiment, a mixture solution for which a stock chemical solution stored in a chemical solution tank and an inert gas dissolved water from which oxygen has been degassed and to which an inert gas has been added are mixed in a piping or valve that leads a liquid from the chemical solution tank to the processing unit 3 is supplied to the center nozzle 45 as the chemical solution.

Although not illustrated, the substrate processing apparatus 1 includes a stock solution tank that stores a stock chemical solution to be supplied to the substrate W, a stock solution piping that leads the stock chemical solution fed from the stock solution tank, an inert gas dissolved water piping that leads an inert gas dissolved water from the inert gas dissolved water supply source, a mixing valve (mixing unit) that generates a chemical solution by mixing the stock chemical solution supplied from the stock chemical solution piping and the inert gas dissolved water supplied from the inert gas dissolved water piping, and a mixture solution piping that leads the chemical solution generated by the mixing valve to the upper chemical solution piping 50.

The stock chemical solution is, for example, hydrofluoric acid. The inert gas dissolved water is, for example, pure water from which oxygen has been degassed and to which nitrogen gas has been added. The concentrations of oxygen and nitrogen in the pure water are the same as the concentrations described above. Where the stock chemical solution is hydrofluoric acid and the inert gas dissolved water is pure water, the chemical solution is dilute hydrofluoric acid (DHF) for which hydrofluoric acid is diluted by pure water at a predetermined proportion (e.g., hydrofluoric acid:pure water=1:10~1000 or more). Dilute hydrofluoric acid is an example of a polymer removing liquid that removes a polymer residue. The stock chemical solution may be a liquid containing one or more of hydrogen fluoride, hydrogen chloride, and ammonium fluoride, besides hydrofluoric acid.

As shown in FIG. 3, the processing unit 3 includes a tubular upper gas flow passage 56 defined by an outer peripheral surface of the center nozzle 45 (outer peripheral face of the casing 48) and the inner peripheral face of the shielding member 31, an upper gas piping 57 that leads an inert gas from an inert gas supply source to the upper gas flow passage 56, an upper gas valve 58 interposed in the upper gas piping 57, and an upper gas flow control valve 59 that increases and decreases the flow rate of the inert gas to be supplied from the upper gas piping 57 to the upper gas flow passage 56.

As shown in FIG. 3, the upper gas flow passage 56 is disposed over the downward discharge port 34 that is opened in the opposed surface 35 of the shielding member 31. When the upper gas valve 58 is opened, the inert gas from the inert gas supply source is supplied to the upper gas flow passage 56 at a flow rate corresponding to the opening degree of the upper gas flow control valve 59. The inert gas supplied to the upper gas flow passage 56 is discharged downward from the downward discharge port 34 of the shielding member 31 through a gap between the outer peripheral surface of the center nozzle 45 and the inner peripheral surface of the shielding member 31. When the upper gas valve 58 is opened in a state where the shielding member 31 is disposed at the down-position, the inert gas discharged from the downward discharge port 34 of the shielding member 31 spreads outward (in a direction to separate from the rotation axis A1) between the substrate W and the shielding member 31. Thereby, the space between the substrate W and the shielding member 31 is filled with the inert gas. The inert gas to be discharged from the downward discharge port 34 of the shielding member 31 is nitrogen gas. The inert gas is not limited to nitrogen gas, and may be another inert gas such as helium gas or argon gas.

FIG. 4 shows a state in which the shielding member 31 is disposed at the down-position and the cup 22 is disposed at the up-position. "Distance D1" means a distance in the vertical direction from the upper surface of the substrate W to the opposed surface 35 of the shielding member 31 when the shielding member 31 is disposed at the down-position. "Distance D2" means a distance in the radial direction from the lower end of the inner peripheral surface 36 of the shielding member 31 to the outer peripheral surface of the spin base 10 when the shielding member 31 is disposed at the down-position. "Distance D3" means a distance in the radial direction from the outer peripheral end of the upper surface of the spin base 10 to the inner peripheral surface 36 of the shielding member 31 when the shielding member 31 is disposed at the down-position. "Distance D4" means a distance in the vertical direction from the upper surface of the spin base 10 to the lower surface of the substrate W. The distance d4 is fixed irrespective of the position of the shielding member 31. "Distance D5" means a distance in the radial direction from the cup inner peripheral end 23a to the shielding member 31 when the shielding member 31 is disposed at the down-position and the cup 22 is disposed at the up-position. The distance D5 corresponds to the shortest distance between the cup upper end portion 23 and the shielding member 31.

The distance D1 is not more than the distance D2. The distance D3 is smaller than the distance D2. The distance D5 is smaller than the distance D2. The distance D5 is smaller than the distance D4. The distance D1 when the shielding member 31 is disposed at the drying position (position shown in FIG. 6C) is smaller than the distance D1 when the shielding member 31 is disposed at the liquid processing position (position shown in FIG. 6B). The distance D1 when the shielding member 31 is disposed at the drying position is smaller than the distance D4. When the shielding member 31 is disposed at the drying position, the distance D1 is smaller than the distance D3. When the shielding member 31 is disposed at the liquid processing position, the distance D1 is not more than the distance D3.

When the shielding member 31 is disposed at the liquid processing position, the distance D1 is, for example, 10 mm, and the distance D2 is, for example, 12 mm.

When the shielding member 31 is disposed at the drying position, the distance D1 is, for example, 2 mm, and the distance D2 is, for example, 12 mm. At this time, the distance D3 is, for example, 6 mm.

The distance D4 is, for example, 10 mm. The distance D5 is, for example, 4 mm.

Figure 5:
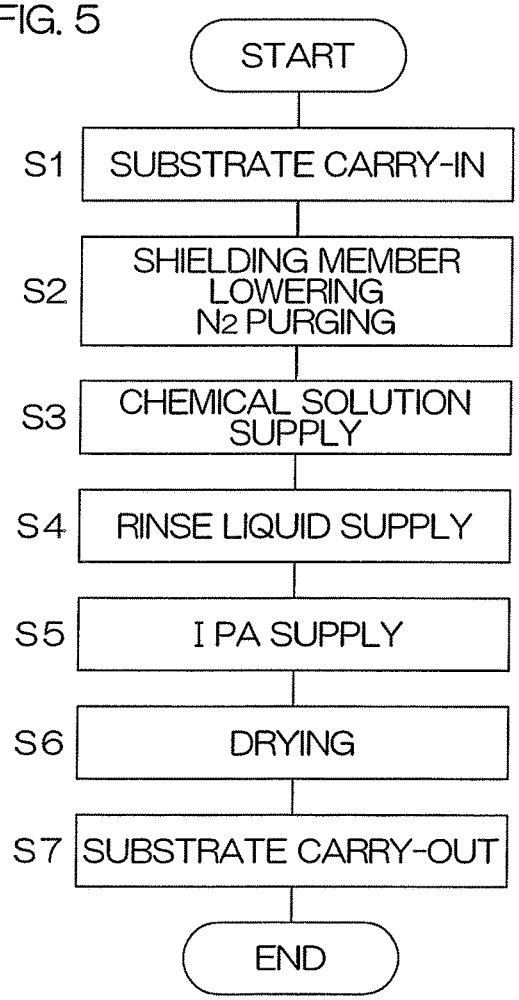
FIG. 5 is a process chart showing a processing example performed by a processing unit.

In the following, a processing example when processing a substrate W by the processing unit 3 will be described with reference to FIG. 2. FIG. 5 is a process chart showing a processing example performed by the processing unit 3. FIG. 6A to FIG. 6C are views showing states of the processing unit 3 when the processing example shown in FIG. 5 is being performed. FIG. 5 and FIG. 6 will be referenced as appropriate.

The substrate W to be processed is, for example, a semiconductor wafer to the front surface of which a polymer residue (residue after dry etching and ashing) is adhered and with a metal pattern exposed at the front surface (refer to FIG. 3). In FIG. 3, reference sign 62 denotes an interlayer insulating film, reference sign 63 denotes a lower wiring groove, reference sign 64 denotes a copper wiring, reference sign 65 denotes an etching stopper film, reference sign 66 denotes a low-dielectric insulating film, reference sign 67 denotes an upper wiring groove, and reference sign 68 denotes a via-hole. The copper wiring 64 is an example of a metal wiring and metal pattern. The substrate W to be processed is not limited to such a semiconductor wafer, and may be one with no metal pattern exposed at the front surface.

As shown in FIG. 5, when processing the substrate W by the processing unit 3, a carry-in step of carrying the substrate W into the processing unit 3 (step S1) is performed.

Specifically, as shown in FIG. 6A, the control device 4 causes the center robot CR to enter the hand H2, which holds the substrate W, into the chamber 5 in a state where the shielding member 31 is retracted to the up-position and the cup 22 is retracted to the down-position. The control device 4 opens the lower gas valve 20 before the substrate W is placed on the plurality of chuck pins 9 to make the upward discharge port 17 of the spin base 10 start to discharge nitrogen gas. Thus, the control device 4 controls the center robot CR such that the substrate W is placed on the plurality of chuck pins 9 in a state where nitrogen gas is being discharged from the upward discharge port 17 of the spin base 10. Thereafter, the control device 4 makes the hand H2 of the center robot CR retract from inside the chamber 5.

Next, as shown in FIG. 5, a purging step (step S2) of discharging an atmosphere containing oxygen from the space between the substrate W and the shielding member 31 is performed by supplying nitrogen gas being an example of the inert gas to the space between the substrate W and the shielding member 31.

Specifically, the control device 4 makes the plurality of chuck pins 9 grip the substrate W after the substrate W is placed on the plurality of chuck pins 9. Thereafter, the control device 4 makes the spin motor 11 start to rotate the substrate W such that the substrate W rotates at a liquid processing speed (e.g., 300 rpm). The control device 4 controls the shielding member raising/lowering unit 41 such that the shielding member 31 moves from the up-position to the down-position (liquid processing position). Further, the control device 4 makes the shielding member rotating unit 40 start to rotate the shielding member 31 such that the shielding member 31 rotates at the same speed in the same direction as those of the substrate W. Also, the control device 4 controls the cup raising/lowering unit 29 such that the cup 22 moves from the down-position to the up-position. The control device 4 opens the upper gas valve 58 in this state to make the downward discharge port 34 of the shielding member 31 start to discharge nitrogen gas. Thereby, the atmosphere containing oxygen is discharged from the space between the substrate W and the shielding member 31, and the space between the substrate W and the shielding member 31 is filled with nitrogen gas.

The discharge of nitrogen gas from the downward discharge port 34 is continued until at least a drying step (step S6 of FIG. 5) ends. Similarly, the discharge of nitrogen gas from the upward discharge port 17 is continued until at least the drying step ends. The discharge flow rate of nitrogen gas from the downward discharge port 34 is set according to the volume of the space between the substrate W and the shielding member 31. The discharge flow rate of nitrogen gas from the upward discharge port 17 is set according to the volume of the space between the substrate W and the spin base 10. The discharge flow rate of nitrogen gas from the downward discharge port 34 may be equal to the discharge flow rate of nitrogen gas from the upward discharge port 17, or may be greater or smaller than the same. The discharge flow rate of nitrogen gas from the downward discharge port 34 is, for example, 50 to 100 (L/min). The discharge flow rate of nitrogen gas from the upward discharge port 17 is, for example, a positive value not more than 100 (L/min).

Next, as shown in FIG. 5, a chemical solution supply step (step S3) of supplying dilute hydrofluoric acid being an example of the chemical solution to the upper surface of the substrate W is performed.

Specifically, the control device 4 opens the lower rinse liquid valve 16 in a state where the shielding member 31 is located at the down-position (liquid processing position) and the cup 22 is located at the up-position to make the lower surface nozzle 14 start to discharge pure water. Thereafter, as shown in FIG. 6B, the control device 4 opens the upper chemical solution valve 51 to make the center nozzle 45 start to discharge the chemical solution. Thereby, the dilute hydrofluoric acid discharged from the center nozzle 45 is supplied to the upper surface central portion of the rotating substrate W in a state where the lower surface of the substrate W is covered with the pure water discharged from the lower surface nozzle 14. The dilute hydrofluoric acid supplied to the upper surface of the substrate W flows outward along the upper surface of the substrate W due to a centrifugal force by rotation of the substrate W. A liquid film of dilute hydrofluoric acid that covers the entire upper surface of the substrate W is formed. When a predetermined time has elapsed since the upper chemical solution valve 51 was opened, the control device 4 closes the upper chemical solution valve 51 to make the center nozzle 45 end the discharge of dilute hydrofluoric acid.

Next, as shown in FIG. 5, a rinse liquid supply step (step S4) of supplying pure water being an example of the rinse liquid to the substrate W is performed.

Specifically, the control device 4 opens the upper rinse liquid valve 53 in a state where the shielding member 31 is located at the down-position (liquid processing position) and the cup 22 is located at the up-position to make the center nozzle 45 start to discharge pure water. Thereby, the pure water discharged from the center nozzle 45 is supplied to the upper surface central portion of the rotating substrate W in a state where the lower surface of the substrate W is covered with the pure water discharged from the lower surface nozzle 14. The pure water supplied to the upper surface of the substrate W flows outward along the upper surface of the substrate W due to a centrifugal force by rotation of the substrate W. Therefore, the dilute hydrofluoric acid on the substrate W is replaced with the pure water, and a liquid film of pure water that covers the entire upper surface of the substrate W is formed. When a predetermined time has elapsed since the upper rinse liquid valve 53 was opened, the control device 4 closes the upper rinse liquid valve 53 to make the center nozzle 45 end the discharge of pure water. Further, the control device 4 closes the lower rinse liquid valve 16 to make the lower surface nozzle 14 end the discharge of pure water.

Next, as shown in FIG. 5, a solvent supply step (step S5) of supplying IPA being an example of the volatile solvent is performed.

Specifically, the control device 4 opens the upper solvent valve 55 in a state where the shielding member 31 is located at the down-position (liquid processing position) and the cup 22 is located at the up-position to make the center nozzle 45 start to discharge IPA. Thereby, the IPA discharged from the center nozzle 45 is supplied to the upper surface central portion of the rotating substrate W. The IPA supplied to the upper surface of the substrate W flows outward along the upper surface of the substrate W due to a centrifugal force by rotation of the substrate W. Therefore, the pure water on the substrate W is replaced with the IPA, and a liquid film of IPA that covers the entire upper surface of the substrate W is formed. When a predetermined time has elapsed since the upper solvent valve 55 was opened, the control device 4 closes the upper solvent valve 55 to make the center nozzle 45 end the discharge of IPA.

Next, as shown in FIG. 5, a drying step (step S6) of drying the substrate W by a high-speed rotation of the substrate W is performed.

Specifically, as shown in FIG. 6C, the control device 4 controls the shielding member raising/lowering unit 41 such that the shielding member 31 falls from the down-position (liquid processing position) to the down-position (drying position) in a state where the cup 22 is located at the up-position. Thereafter, the control device 4 controls the spin motor 11 such that the rotation speed of the substrate W increases to a drying speed (e.g., 1500 rpm) greater than the liquid processing speed and the substrate W rotates at the drying speed. A great centrifugal force is thereby applied to the liquid adhered to the substrate W, and the liquid is spun off from the substrate W to the periphery. Therefore, the liquid is removed from the substrate W, and the substrate W dries out. When a predetermined time has elapsed since the high-speed rotation of the substrate W was started, the control device 4 makes the spin motor 11 stop the rotation of the substrate W. Further, the control device 4 makes the shielding member rotating unit 40 stop the rotation of the shielding member 31.

Next, as shown in FIG. 5, a carry-out step (step S7) of carrying the substrate W out of the processing unit 3 is performed.

Specifically, the control device 4 makes the plurality of chuck pins 9 release the gripping of the substrate W. Also, the control device 4 controls the shielding member raising/lowering unit 41 such that the shielding member 31 moves from the down-position (drying position) to the up-position. The control device 4 further controls the cup raising/lowering unit 29 such that the cup 22 moves from the up-position to the down-position. The control device 4 makes the hand H2 of the center robot CR enter into the chamber 5 in this state. Then, the control device 4 makes the hand H2 of the center robot CR hold the substrate W on the plurality of chuck pins 9. Thereafter, the control device 4 makes the hand H2 of the center robot CR retract from inside the chamber 5. The processed substrate W is thereby carried out of the chamber 5.

As described above, in the first preferred embodiment, the substrate W is disposed over the spin base 10. The opposed surface 35 of the shielding member 31 is disposed over the substrate W. The inner peripheral surface 36 of the shielding member 31 is disposed around the substrate W. In this state, an inert gas is discharged downward from the downward discharge port 34 that is opened in the opposed surface 35 of the shielding member 31. The inert gas discharged from the downward discharge port 34 of the shielding member 31 spreads in a space between the upper surface of the substrate W and the opposed surface 35 of the shielding member 31, and is discharged from a gap between the lower end of the inner peripheral surface 36 of the shielding member 31 and the outer peripheral surface of the spin base 10. Because the space between the substrate W and the shielding member 31 is thereby filled with the inert gas, the concentration of oxygen in an atmosphere that contacts the upper surface and outer peripheral surface of the substrate W is reduced.

The lower end of the inner peripheral surface 36 of the shielding member 31 is opposed in the radial direction to the outer peripheral surface of the spin base 10 across an interval. The lower end of the inner peripheral surface 36 of the shielding member 31 and the outer peripheral surface of the spin base 10 define an annular discharge port to discharge an atmosphere between the substrate W and the shielding member 31. When the distance D2 in the radial direction from the lower end of the inner peripheral surface 36 of the shielding member 31 and the outer peripheral surface of the spin base 10 is small, the opening area of the discharge port is small, which thus hinders discharging the atmosphere, and the atmosphere may be retained between the substrate W and the shielding member 31. When the retention of the atmosphere occurs, the oxygen concentration may not sufficiently decrease in a partial region between the substrate W and the shielding member 31 in some cases.

The distance D2 in the radial direction from the lower end of the inner peripheral surface 36 of the shielding member 31 to the outer peripheral surface of the spin base 10 is not less than the distance D1 in the vertical direction from the upper surface of the substrate W held by the spin chuck 8 to the opposed surface 35 of the shielding member 31. Thus, the opening area of the exhaust port can be increased as compared to when the distance D2 in the radial direction is smaller than the distance D1 in the vertical direction. Because the efficiency of discharging the atmosphere is thereby enhanced, retention of the atmosphere between the substrate W and the shielding member 31 can be suppressed or prevented.

Also, the inert gas discharged from the downward discharge port 34 is diffused in the radial direction of the substrate W in the space between the opposed surface 35 of the shielding member 31 and the upper surface of the substrate W, and is discharged to the interior of the cup 22 from the annular discharge port between the lower end of the inner peripheral surface 36 of the shielding member 31 and the outer peripheral surface of the spin base 10. If the height of the space where the inert gas is diffused is narrowed in the middle, the inert gas diffusion is obstructed at that narrowed part, and the inert gas may be retained. In the present preferred embodiment, because the distance D1 is not more than the distance D3 and the distance D3 is smaller than the distance D2 (refer to FIG. 4 and FIG. 6C) when the shielding member 31 is at the down-position (drying position), the height of the diffusion space of the inert gas does not become smaller than the vertical distance of the opposed surface 35 of the shielding member 31 and the upper surface of the substrate W. Thus, the diffusion of the inert gas is not obstructed in the course from the inert gas being discharged from the downward discharge port 34 to the inert gas being discharged from the annular discharge port. Therefore, retention of the atmosphere between the substrate W and the shielding member 31 can be reliably suppressed or prevented.

Further, the gas between the substrate W and the shielding member 31 is suctioned toward the cup 22. The cup 22 surrounds the spin base 10. The lower end of the inner peripheral surface 36 of the shielding member 31 is disposed around the spin base 10. Thus, the lower end of the inner peripheral surface 36 of the shielding member 31 is disposed in the interior of the cup 22 or in the vicinity of the opening of the cup 22. The lower end of the inner peripheral surface 36 of the shielding member 31 defines, in conjunction with the outer peripheral surface of the spin base 10, an annular exhaust port to discharge an atmosphere between the substrate W and the shielding member 31. Thus, the exhaust port is disposed in the interior of the cup 22 or in the vicinity of the opening of the cup 22. Therefore, a suction force to suck the gas into the cup 22 is efficiently transmitted to the space between the substrate W and the shielding member 31. Discharge of the gas from the space between the substrate W and the shielding member 31 is thereby facilitated, and the occurrence of retention is suppressed.

In the first preferred embodiment, the shielding member rotating unit 40 rotates the shielding member 31 about the rotation axis A1 in the same direction as that of the substrate W. When the shielding member rotating unit 40 rotates the shielding member 31, an airflow directed outward is formed between the upper surface of the substrate W and the opposed surface 35 of the shielding member 31. Similarly, when the spin chuck 8 rotates the substrate W, an airflow directed outward is formed between the upper surface of the substrate W and the opposed surface 35 of the shielding member 31. Discharge of the gas from the space between the substrate W and the shielding member 31 is facilitated by these airflows. Further, because the substrate W and the shielding member 31 are the same in rotation direction, these airflows are unlikely to cancel each other out. Thus, the gas can be efficiently discharged from the space between the substrate W and the shielding member 31.

In the first preferred embodiment, an annular clearance (the annular inlet 42, the annular flow passage 43, and the annular outlet 44) surrounding the rotation axis A1 is provided between the cup upper end portion 23 and the shielding member 31. A gas to be suctioned into the cup 22 flows to the interior of the cup 22 through the annular clearance. The distance D5 between the cup upper end portion 23 and the shielding member 31 is smaller than the distance D2 in the radial direction from the lower end of the inner peripheral surface 36 of the shielding member 31 to the outer peripheral surface of the spin base 10. Thus, the flow passage area of the annular clearance is small, and resistance that is applied to a gas that intends to flow in the annular clearance from over the cup 22 is great. Therefore, the atmosphere containing oxygen is unlikely to flow into the cup 22.

In the first preferred embodiment, the annular flow passage 43 provided between the cup upper end portion 23 and the shielding member 31 extends upward from the annular outlet 44. Thus, a gas that has flowed in the annular inlet 42 from over the cup 22 is guided downward by the annular flow passage 43, and is discharged downward from the annular outlet 44. The substrate W held by the spin chuck 8 is disposed further on the inner side than the annular outlet 44. Thus, the atmosphere containing oxygen is less likely to approach the substrate W than when the annular outlet 44 discharges the gas inward.

In the first preferred embodiment, the annular inner inclined portion 36a extending outward obliquely downward from the opposed surface 35 of the shielding member 31 is provided in the inner peripheral surface 36 of the shielding member 31. The inner inclined portion 36a has a curved section. The atmosphere between the substrate W and the shielding member 31 moves to the gap between the inner peripheral surface 36 of the shielding member 31 and the outer peripheral surface of the spin base 10 through the space between the upper surface of the substrate W and the opposed surface 35 of the shielding member 31. When the inner peripheral surface 36 of the shielding member 31 extends vertically downward from the opposed surface 35 of the shielding member 31, retention of the atmosphere is likely to occur at a coupling portion (corner portion) of the inner peripheral surface 36 of the shielding member 31 and the opposed surface 35 of the shielding member 31. On the other hand, when the coupling portion of the inner peripheral surface 36 of the shielding member 31 and the opposed surface 35 of the shielding member 31 extends outward obliquely downward from the opposed surface 35, such retention is unlikely to occur. Therefore, retention of the atmosphere between the substrate W and the shielding member 31 can be suppressed or prevented.

In the first preferred embodiment, because the downward discharge port 34 of the shielding member 31 discharges an inert gas, the atmosphere around the substrate W is unlikely to enter into the space between the upper surface of the substrate W and the opposed surface 35 of the shielding member 31. However, it can also be considered that the atmosphere around the substrate W temporarily enters into the space between the upper surface of the substrate W and the opposed surface 35 of the shielding member 31. For example, it can also be considered that the atmosphere between the lower surface of the substrate W and the upper surface of the spin base 10 moves to the space between the upper surface of the substrate W and the opposed surface 35 of the shielding member 31.

By making an inert gas be discharged from the upward discharge port 17 of the spin base 10 in a state where an inert gas is being discharged from the downward discharge port 34 of the shielding member 31, the atmosphere containing oxygen can be suppressed or prevented from moving to the space between the upper surface of the substrate W and the opposed surface 35 of the shielding member 31. The concentration of oxygen in an atmosphere that contacts the substrate W can thereby be reduced.

In the first preferred embodiment, an inert gas is discharged from the upward discharge port 17 of the spin base 10. The substrate W is placed on the chuck pins 9 by the center robot CR in this state. While the substrate W is approaching the chuck pins 9, the inert gas discharged from the upward discharge port 17 of the spin base 10 spreads between the substrate W and the spin base 10 to discharge the atmosphere containing oxygen. Because not only is the interval of the substrate W and the spin base 10 narrow but the plurality of chuck pins 9 are disposed around the space therebetween, the atmosphere between the substrate W and the spin base 10 is unlikely to be discharged. Thus, by discharging the atmosphere containing oxygen in advance, this atmosphere can be suppressed or prevented from moving from the space between the substrate W and the spin base 10 to the space between the substrate W and the shielding member 31.

In the first preferred embodiment, the cup upper end portion 23 is disposed around the shielding member 31. The cup 22 and the shielding member 31 define the annular outlet 44 to discharge a gas flowed in the gap between the cup 22 and the shielding member 31 from the gap therebetween. Because the cup upper end portion 23 is disposed in the periphery of the shielding member 31, the annular outlet 44 is further away outward from the substrate W than when the cup upper end portion 23 is disposed under the shielding member 31. Thus, a gas suctioned into the cup 22 is unlikely to enter into the space between the substrate W and the shielding member 31. Further, because the cup upper end portion 23 is not overlapped with the shielding member 31 in a plan view, the cup upper end portion 23 does not contact the shielding member 31 even if one or both of the cup 22 and the shielding member 31 are raised or lowered.

Second Preferred Embodiment

Next, a second preferred embodiment of the present invention will be described. In FIG. 7 below, component portions equivalent to respective portions indicated in FIG. 1 to FIG. 6 described above are designated by the same reference signs as in FIG. 1, etc., and description thereof will be omitted.

A principal point of difference between the shielding member according to the first preferred embodiment and the shielding member according to the second preferred embodiment is that the shielding members are different from each other in the shape of the inner peripheral surface thereof.

As shown in FIG. 7, the inner peripheral surface 236 of the shielding member 231 according to the second preferred embodiment includes an annular inner inclined portion 236a extending outward obliquely downward from the opposed surface 35 of the disk portion 32, and an annular inner vertical portion 236b extending vertically downward from the lower end (outer end) of the inner inclined portion 236a. The inner inclined portion 236a has a linear section that is obliquely inclined at a fixed inclination angle with respect to the rotation axis A1. The inner diameter of the inner inclined portion 236a increases as it gets closer to the lower end of the inner inclined portion 236a. The lower end of the inner inclined portion 236a has an inner diameter equal to the inner diameter of the inner vertical portion 236b. The inner diameter of the inner vertical portion 236b is greater than the outer diameter of the spin base 10.

As described above, in the second preferred embodiment, the annular inner inclined portion 236a extending outward obliquely downward from the opposed surface 35 of the shielding member 231 is provided in the inner peripheral surface 236 of the shielding member 231. The inner inclined portion 236a has a linear section. Because the coupling portion (corner portion) of the inner peripheral surface 236 of the shielding member 231 and the opposed surface 35 of the shielding member 231 extends outward obliquely downward from the opposed surface 35, retention of the atmosphere is unlikely to occur in the corner portion of the shielding member 231. Therefore, retention of the atmosphere between the substrate W and the shielding member 231 can be suppressed or prevented.

Third Preferred Embodiment

Next, a third preferred embodiment of the present invention will be described. In FIG. 8 below, component portions equivalent to respective portions indicated in FIG. 1 to FIG. 7 described above are designated by the same reference signs as in FIG. 1, etc., and description thereof will be omitted.

A principal point of difference between the shielding member according to the first preferred embodiment and the shielding member according to the third preferred embodiment is that an annular overhanging portion that overlaps the cup in a plan view is provided in the shielding member according to the third preferred embodiment.

As shown in FIG. 8, the shielding member 331 according to the third preferred embodiment includes an annular overhanging portion 360 disposed further on the outer side than the lower end of the cylinder portion 33, in addition to the disk portion 32 and the cylinder portion 33. The overhanging portion 360 is disposed higher than the lower end of the cylinder portion 33. The outer diameter of the overhanging portion 360 is greater than the inner diameter of the cup upper end portion 23. The overhanging portion 360 is located over the cup upper end portion 23. The overhanging portion 360 is overlapped with the cup 22 when the cup 22 and the shielding member 331 are viewed from above. The shielding member 331 includes an annular step portion 361 having an L-shaped section defined by a lower surface of the overhanging portion 360 and the outer peripheral surface 37 (outer vertical portion 37b) of the cylinder portion 33.

As shown in FIG. 8, when the shielding member 331 is disposed at the down-position and the cup 22 is disposed at the up-position, the cup upper end portion 23 surrounds the cylinder portion 33 of the shielding member 331 across an interval in the radial direction, and is opposed in the up-down direction to the overhanging portion 360 of the shielding member 331 across an interval. At this time, the cup 22 and the shielding member 331 define, between the cup 22 and the shielding member 331, an annular inlet 342 in which a gas to be suctioned into the cup 22 flows, an annular outlet 344 that discharges a gas having flowed in the annular inlet 342 to the interior of the cup 22, and an annular flow passage 343 extending from the annular inlet 342 to the annular outlet 344.

As shown in FIG. 8, the annular inlet 342 is disposed over the cup 22. The annular inlet 342 is disposed further on the outer side than the annular outlet 344. The annular flow passage 343 includes an annular upstream portion 343a extending inward from the annular inlet 342, an annular downstream portion 343c extending upward from the annular outlet 344, and a corner portion 343b having an L-shaped section and connecting the upstream portion 343a and the downstream portion 343c each other. A gas that has flowed in the upstream portion 343a of the annular flow passage 343 from the annular inlet 342 is changed in direction in the corner portion 343b of the annular flow passage 343, and is guided downward by the downstream portion 343c of the annular flow passage 343. A gas that has flowed in the annular inlet 342 is thereby discharged downward from the annular outlet 344.

As described above, in the third preferred embodiment, when the shielding member 331 is disposed at the down-position and the cup 22 is disposed at the up-position, the cup upper end portion 23 is opposed in the up-down direction to the overhanging portion 360 of the shielding member 331 across an interval. Thus, the upstream portion 343a of the annular flow passage 343 extending in the radial direction is provided between the cup upper end portion 23 and the overhanging portion 360 of the shielding member 331. Further, at this time, the cup upper end portion 23 is opposed in the radial direction to the cylinder portion 33 of the shielding member 331 across an interval. Thus, the downstream portion 343c of the annular flow passage 343 extending in the up-down direction is provided between the cup upper end portion 23 and the cylinder portion 33 of the shielding member 331. Therefore, the corner portion 343b having an L-shaped section is provided between the upstream portion 343a and the downstream portion 343c.

As described above, when the shielding member 331 is disposed at the down-position and the cup 22 is disposed at the up-position, the annular flow passage 343 provided between the cup upper end portion 23 and the shielding member 331 is bent and thereby has the corner portion 343b having an L-shaped section. Thus, resistance that is applied to a gas flowing through the annular flow passage 343 increases as compared to when the annular flow passage 343 is in a linear shape. Therefore, the atmosphere containing oxygen is unlikely to enter into the interior of the cup 22 through the gap between the cup 22 and the shielding member 331. Accordingly, the atmosphere containing oxygen is unlikely to approach the substrate W. The concentration of oxygen in an atmosphere that contacts the substrate W can thereby be reduced.

Fourth Preferred Embodiment

Next, a fourth preferred embodiment of the present invention will be described. In FIG. 9 below, component portions equivalent to respective portions indicated in FIG. 1 to FIG. 8 described above are designated by the same reference signs as in FIG. 1, etc., and description thereof will be omitted.

A principal point of difference between the shielding member according to the first preferred embodiment and the shielding member according to the fourth preferred embodiment is that the cup upper end portion is disposed under the shielding member.

As shown in FIG. 9, the cylinder portion 33 of the shielding member 431 according to the fourth preferred embodiment is disposed over the cup upper end portion 23. The cylinder portion 33 of the shielding portion 431 is overlapped with the cup upper end portion 23 when the cup 22 and the shielding member 431 are viewed from above. When the shielding member 431 is disposed at the down-position and the cup 22 is disposed at the up-position, the cylinder portion 33 of the shielding member 431 and the cup upper end portion 23 are opposed in the up-down direction across an interval. The up-position of the cup 22 is a position where the cup upper end portion 23 is located lower than the upper surface of the spin base 10. The up-position of the cup 22 may be the same position as the down-position of the cup 22.

As shown in FIG. 9, when the shielding member 431 is disposed at the down-position and the cup 22 is disposed at the up-position, the cup upper end portion 23 is opposed in the up-down direction to the cylinder portion 33 of the shielding member 431 across an interval. At this time, the cup 22 and the shielding member 431 define, between the cup 22 and the shielding member 431, an annular inlet 442 in which a gas to be suctioned into the cup 22 flows, an annular outlet 444 that discharges a gas having flowed in the annular inlet 442 to the interior of the cup 22, and an annular flow passage 443 extending from the annular inlet 442 to the annular outlet 444. The annular inlet 442 is disposed around the annular outlet 444. A gas that has flowed in the annular inlet 442 is guided inward by the annular flow passage 443, and is discharged inward from the annular outlet 444.

As described above, in the fourth preferred embodiment, the cup upper end portion 23 is disposed under the shielding member 431. The cup 22 and the shielding member 431 define the annular outlet 444 to discharge a gas flowed in the gap between the cup 22 and the shielding member 431 from the gap therebetween. Because the cup upper end portion 23 is disposed under the shielding member 431, the annular outlet 444 is further away downward from the substrate W than when the cup upper end portion 23 is disposed in the periphery of the shielding member 431. Thus, a gas suctioned into the cup 22 is unlikely to enter into the space between the substrate W and the shielding member 431.

In the conventional substrate processing apparatus, the cup upper end portion is disposed higher than the substrate held by the spin chuck in order to receive a processing liquid having scattered from the substrate to its periphery by an inner surface of the cup. On the other hand, because the hand of the center robot is disposed over the spin base when the substrate is carried in and carried out, the cup upper end portion is disposed lower than the upper surface of the spin base in order to avoid a collision of the hand with the cup when the substrate is carried in and carried out. It is thus necessary to raise and lower the cup such that the cup upper end portion moves at a position higher than the upper surface of the spin base and a position lower than the upper surface of the spin base.

In contrast thereto, in the fourth preferred embodiment, the inner peripheral surface 36 of the shielding member 431 is disposed in the periphery of the substrate W held by the spin chuck 8. A processing liquid discharged from the substrate W to the periphery is received by the inner peripheral surface 36 of the shielding member 431 to be guided downward. Thereafter, the processing liquid flows down into the cup 22 that is open upward. Thus, the cup upper end portion 23 does not need to be disposed higher than the substrate W when the processing liquid is being supplied to the upper surface of the substrate W. Therefore, the cup 22 does not need to be raised or lowered before or after the substrate W is carried in and carried out. The time required for carrying in and carrying out the substrate W can be reduced. Also, if raising and lowering of the cup 22 is unnecessary, the cup raising and lowering unit 29 (refer to FIG. 2) can even be omitted.

Fifth Preferred Embodiment

Next, a fifth preferred embodiment of the present invention will be described. In FIG. 10 below, component portions equivalent to respective portions indicated in FIG. 1 to FIG. 9 described above are designated by the same reference signs as in FIG. 1, etc., and description thereof will be omitted.

A principal point of difference between the shielding member according to the fourth preferred embodiment and the shielding member according to the fifth preferred embodiment is that the annular step portion having an L-shaped section is provided in the cup upper end portion.

As shown in FIG. 10, the cup upper end portion 523 according to the fifth preferred embodiment includes an annular step portion 561 having an L-shaped section, in addition to the cup inner peripheral end 23a and the cup lower end 23b. The annular step portion 561 includes an annular upwardly facing surface 561a disposed higher than the cup inner peripheral end 23a, and an annular inwardly facing surface 561b extending upward from the outer peripheral end of the upwardly facing surface 561a. The inner diameter of the inwardly facing surface 561b is greater than the outer diameter of the shielding member 31.

As shown in FIG. 10, when the shielding member 31 is disposed at the down-position and the cup 522 is disposed at the up-position, the inwardly facing surface 561b of the cup 522 is opposed in the radial direction to the shielding member 31 across an interval, and the upwardly facing surface 561a of the cup 522 is opposed in the up-down direction to the shielding member 31 across an interval. At this time, the cup 522 and the shielding member 31 define, between the cup 522 and the shielding member 31, an annular inlet 542 in which a gas to be suctioned into the cup 522 flows, an annular outlet 544 that discharges a gas having flowed in the annular inlet 542 to the interior of the cup 522, and an annular flow passage 543 extending from the annular inlet 542 to the annular outlet 544.

As shown in FIG. 10, the annular inlet 542 is disposed over the cup 522. The annular inlet 542 is disposed further on the outer side than the annular outlet 544. The annular flow passage 543 includes an annular upstream portion 543a extending downward from the annular inlet 542, an annular downstream portion 543c extending outward from the annular outlet 544, and a corner portion 543b having an L-shaped section and connecting the upstream portion 543a and the downstream portion 543c each other. A gas that has flowed in the upstream portion 543a of the annular flow passage 543 from the annular inlet 542 is changed in direction in the corner portion 543b of the annular flow passage 543, and is guided inward by the downstream portion 543c of the annular flow passage 543. A gas that has flowed in the annular inlet 542 is thereby discharged inward from the annular outlet 544.

As described above, in the fifth preferred embodiment, when the shielding member 31 is disposed at the down-position and the cup 522 is disposed at the up-position, the inwardly facing surface 561b of the cup 552 is opposed in the radial direction to the shielding member 31 across an interval. Thus, the upstream portion 543a of the annular flow passage 543 extending in the up-down direction is provided between the cup upper end portion 523 and the cylinder portion 33 of the shielding member 31. Further, at this time, the upwardly facing surface 561a of the cup 522 is opposed in the up-down direction to the cylinder portion 33 of the shielding member 31 across an interval. Thus, the downstream portion 543c of the annular flow passage 543 extending inward is provided between the cup upper end portion 523 and the cylinder portion 33 of the shielding member 31. Therefore, the corner portion 543b having an L-shaped section is provided between the upstream portion 543a and the downstream portion 543c. Because resistance that is applied to a gas flowing inside the annular flow passage 543 thus increases, the atmosphere containing oxygen can be suppressed or prevented from approaching the substrate W.

Other Preferred Embodiments

Although first to fifth preferred embodiments of the present invention have been described above, the present invention is not restricted to the contents of the first to fifth preferred embodiments and various modifications are possible within the scope of the present invention.

For example, in the first preferred embodiment, a description has been given of the case where the shielding member rotating unit 40 is provided, but the shielding member rotating unit 40 may be omitted, and the shielding member 31 may be fixed in the rotation direction.

In the first preferred embodiment, a description has been given of the case where the distance D5 (refer to FIG. 4) between the cup upper end portion 23 and the shielding member 31 is smaller than the distance D2 in the radial direction from the lower end of the inner peripheral surface 36 of the shielding member 31 to the outer peripheral surface of the spin base 10, but the distance D5 may be equal to the distance D2, or may be greater than the distance D2.

In the first preferred embodiment, a description has been given of the case where the substrate W is placed on the plurality of chuck pins 9 in a state where nitrogen gas is being discharged from the upward discharge port 17 of the spin base 10, a discharge of nitrogen gas from the upward discharge port 17 may be started after the substrate W is placed on the chuck pins 9.

In the first preferred embodiment, a description has been given of the case where the chemical solution and rinse liquid are discharged from the common nozzle (the first tube 46 of the center nozzle 45), but the chemical solution and rinse liquid may be discharged from separate nozzles. For example, when IPA is not supplied to the substrate W, the chemical solution may be discharged from the first tube 46 and the rinse liquid may be discharged from the second tube 47.

Features of two or more of the various preferred embodiments described above may be combined.

The present application corresponds to Japanese Patent Application No. 2014-27748 filed in the Japan Patent Office on Feb. 17, 2014, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing apparatus comprising:
a spin chuck including a disk-shaped spin base including a circular upper surface disposed under a substrate and an outer peripheral surface whose outer diameter is greater than that of the substrate, a plurality of chuck pins that hold a substrate horizontally such that a lower surface of the substrate and the upper surface of the spin base are opposed in an up-down direction across an interval, and a spin motor that rotates the spin base and the plurality of chuck pins about a vertical rotation axis passing through a central portion of the substrate held by the plurality of chuck pins;
a shielding member including a disk portion, which includes an opposed surface disposed over the substrate held by the spin chuck, and a cylinder portion, which includes an inner peripheral surface surrounding the substrate held by the spin chuck about the rotation axis and an outer peripheral surface provided with an annular outer vertical portion extending vertically, wherein a lowest end of the inner peripheral surface is disposed around the spin base, and a distance in a radial direction from the lowest end of the inner peripheral surface to the outer peripheral surface of the spin base is not less than a distance in a vertical direction from the upper surface of the substrate held by the spin chuck to the opposed surface;
an upper inert gas supply unit that causes a downward discharge port provided at the opposed surface of the shielding member to discharge downward an inert gas;
a cup that is open upward and includes a cup tubular portion that surrounds the spin base about the rotation axis, an annular cup upper end portion that is disposed at a more inward position than the cup tubular portion and an annular cup inclined portion that extends obliquely upward from the cup tubular portion to the cup upper end portion; and
an exhaust unit that discharges a gas in the cup to outside of the cup; wherein
the cup upper end portion includes an annular cup inner peripheral end, which defines a circular opening having a diameter greater than the outer diameter of the outer peripheral surface of the spin base, and a cup lower end extending downward from an inner end of the cup inclined portion,
the cup inner peripheral end is a portion that is positioned most inward in the cup upper end portion,
the cylinder portion of the shielding member is disposed between the cup upper end portion and the spin base,
the lowest end of the inner peripheral surface of the shielding member and the outer peripheral surface of the spin base define an annular discharge port which discharges an atmosphere between the substrate and the shielding member, and
the outer vertical portion of the cylinder portion of the shielding member and the cup lower end define an annular clearance between the outer vertical portion and the cup lower end.

2. The substrate processing apparatus according to claim 1, further comprising a shielding member rotating unit that rotates the shielding member about the rotation axis in a direction the same as that of the substrate held by the spin chuck.

3. The substrate processing apparatus according to claim 1, wherein the annular clearance between the cup upper end portion and the shielding member includes an annular inlet in which a gas to be suctioned into the cup flows, an annular outlet that discharges a gas having flowed in the annular inlet to an interior of the cup, and an annular flow passage extending from the annular inlet to the annular outlet, and
the annular flow passage extends upward from the annular outlet.

4. The substrate processing apparatus according to claim 1, wherein the annular clearance between the cup upper end portion and the shielding member includes an annular inlet in which a gas to be suctioned into the cup flows, an annular outlet that discharges a gas having flowed in the annular inlet to an interior of the cup, and an annular flow passage extending from the annular inlet to the annular outlet, and the annular flow passage includes a corner portion including an L-shaped section.

5. The substrate processing apparatus according to claim 4, wherein the shielding member includes an annular overhanging portion disposed outward with respect to a lower end of the cylinder portion, and
the cup upper end portion is disposed under the overhanging portion of the shielding member and surrounds the cylinder portion of the shielding member about the rotation axis across an interval in the radial direction and opposes the overhanging portion in the up-down direction across an interval.

6. The substrate processing apparatus according to claim 1, wherein the inner peripheral surface of the shielding member includes an annular inner inclined portion extending outward obliquely downward from the opposed surface of the shielding member.

7. The substrate processing apparatus according to claim 6, wherein a distance in the radial direction from the annular inner inclined portion of the shielding member to an outer peripheral end of the upper surface of the spin base is not less than the distance in the vertical direction from the upper surface of the substrate held by the spin chuck to the opposed surface of the shielding member.

8. The substrate processing apparatus according to claim 6, wherein
the inner inclined portion provided in the inner peripheral surface of the shielding member includes an arc-shaped section an inclination angle of which with respect to the rotation axis continuously changes.

9. The substrate processing apparatus according to claim 1, further comprising:
a lower inert gas supply unit that causes an upward discharge port provided at the upper surface of the spin base to discharge upward an inert gas; and
a control device that controls the upper inert gas supply unit and lower inert gas supply unit such that an inert gas is discharged from the upward discharge port of the spin base in a state where an inert gas is being discharged from the downward discharge port of the shielding member.

10. The substrate processing apparatus according to claim 9, further comprising a transfer robot that places the substrate on the plurality of chuck pins, wherein
the control device controls the transfer robot and lower inert gas supply unit such that the substrate is placed on the plurality of chuck pins in a state where an inert gas is being discharged from the upward discharge port of the spin base.

11. The substrate processing apparatus according to claim 1, further comprising:
a transfer robot including a hand that is movable to over the spin base, performing a carry-in operation to place the substrate on the plurality of chuck pins and a carry-out operation to take the substrate on the plurality of chuck pins by use of the hand; and
a processing liquid supply unit that causes the downward discharge port provided at the opposed surface of the shielding member to discharge downward a processing liquid in a state where the cup is located lower than the upper surface of the spin base.

12. The substrate processing apparatus according to claim 1, further comprising a processing liquid supply unit that causes the downward discharge port provided at the opposed surface of the shielding member to discharge downward a processing liquid containing inert gas dissolved water from which oxygen has been degassed and to which an inert gas has been added.

13. The substrate processing apparatus according to claim 1, wherein the substrate processing apparatus is an apparatus to process a substrate with a metal pattern exposed at a front surface of the substrate.

14. The substrate processing apparatus according to claim 1, wherein
the distance in the vertical direction from the upper surface of the substrate held by the spin chuck to the opposed surface, is not more than a distance in the radial direction from the inner peripheral surface of the shielding member to an outer peripheral end of the upper surface of the spin base, and
the distance in the radial direction from the inner peripheral surface of the shielding member to the outer peripheral end of the upper surface of the spin base, is less than the distance in the radial direction from the lowest end of the inner peripheral surface of the shielding member to the outer peripheral surface of the spin base.

* * * * *